US011222900B2

(12) United States Patent
Shimojo et al.

(10) Patent No.: US 11,222,900 B2
(45) Date of Patent: Jan. 11, 2022

(54) SEMICONDUCTOR MEMORY DEVICE

(71) Applicant: Toshiba Memory Corporation, Minato-ku (JP)

(72) Inventors: Yoshiro Shimojo, Yokohama (JP); Tomoya Sanuki, Suzuka (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/228,867

(22) Filed: Dec. 21, 2018

(65) Prior Publication Data
US 2020/0043942 A1 Feb. 6, 2020

Related U.S. Application Data

(60) Provisional application No. 62/712,573, filed on Jul. 31, 2018.

(51) Int. Cl.
| *H01L 29/792* | (2006.01) |
| *H01L 27/11582* | (2017.01) |
| *H01L 27/11565* | (2017.01) |
| *G11C 16/04* | (2006.01) |
| *H01L 23/522* | (2006.01) |
| *H01L 23/528* | (2006.01) |
| *H01L 27/1157* | (2017.01) |

(52) U.S. Cl.
CPC .... *H01L 27/11582* (2013.01); *G11C 16/0483* (2013.01); *H01L 23/5226* (2013.01); *H01L 23/5283* (2013.01); *H01L 27/1157* (2013.01); *H01L 27/11565* (2013.01)

(58) Field of Classification Search
CPC ............ H01L 23/5226; H01L 23/5283; H01L 27/11565; H01L 27/1157; H01L 27/11582; H01L 27/11575
See application file for complete search history.

(56) References Cited

U.S. PATENT DOCUMENTS

| 7,539,056 B2 | 5/2009 | Katsumata et al. |
| 8,436,414 B2 | 5/2013 | Tanaka et al. |
| 9,553,101 B2 | 1/2017 | Kim et al. |

(Continued)

FOREIGN PATENT DOCUMENTS

| JP | 2008-192708 | 8/2008 |
| JP | 2010-192569 | 9/2010 |
| JP | 2015-012296 | 1/2015 |

*Primary Examiner* — Meiya Li
(74) *Attorney, Agent, or Firm* — Oblon, McClelland, Maier & Neustadt, L.L.P.

(57) ABSTRACT

According to one embodiment, a semiconductor memory device includes: a first interconnect layer including a first electrode that extends in a first direction and a second electrode that extends in a second direction and is in contact with one end of the first electrode; a second interconnect layer including a third electrode that is provided adjacently to the first electrode and a fourth electrode that is in contact with one end of the third electrode; a first semiconductor layer provided between the first electrode and the third electrode; a first charge storage layer provided between the first semiconductor layer and the first electrode; a second charge storage layer provided between the first semiconductor layer and the third electrode; and a first bit line provided above the first semiconductor layer and extending in the first direction.

18 Claims, 39 Drawing Sheets

(56) References Cited

U.S. PATENT DOCUMENTS

| | | | |
|---|---|---|---|
| 2013/0279256 A1* | 10/2013 | Costa | G11C 16/3445 365/185.17 |
| 2017/0040061 A1* | 2/2017 | Yeh | G11C 16/0483 |
| 2017/0271348 A1 | 9/2017 | Arai et al. | |
| 2017/0338243 A1 | 11/2017 | Sohn et al. | |

* cited by examiner

SEMICONDUCTOR MEMORY DEVICE

CROSS-REFERENCE TO RELATED APPLICATIONS

This application claims the benefit of U.S. Provisional Application No. 62/712,573, filed Jul. 31, 2018, the entire contents of which are incorporated herein by reference.

FIELD

Embodiments described herein relate generally to a semiconductor memory device.

BACKGROUND

A NAND flash memory is known as a semiconductor memory device.

DETAILED DESCRIPTION

In general, according to one embodiment, a semiconductor memory device includes: a first interconnect layer including a first electrode that extends in a first direction, and a second electrode that extends in a second direction and is in contact with one end of the first electrode, the second direction intersecting the first direction; a second interconnect layer including a third electrode that is provided adjacently to the first electrode in the second direction, is non-electrically coupled to the first electrode, and extends in the first direction, and a fourth electrode that extends in the second direction and is in contact with one end of the third electrode; a first semiconductor layer provided between the first electrode and the third electrode and extending in a third direction intersecting the first and second directions; a first charge storage layer provided between the first semiconductor layer and the first electrode; a second charge storage layer provided between the first semiconductor layer and the third electrode; and a first bit line provided above the first semiconductor layer, extending in the first direction, and electrically coupled to the first semiconductor layer.

1. First Embodiment

A semiconductor memory device according to a first embodiment will be described. Hereinafter, a three-dimensionally stacked type NAND flash memory in which memory cell transistors are three-dimensionally stacked above a semiconductor substrate will be described as an example of the semiconductor memory device.

1.1 Configuration

1.1.1 Overall Configuration of Semiconductor Memory Device

Figure 1:
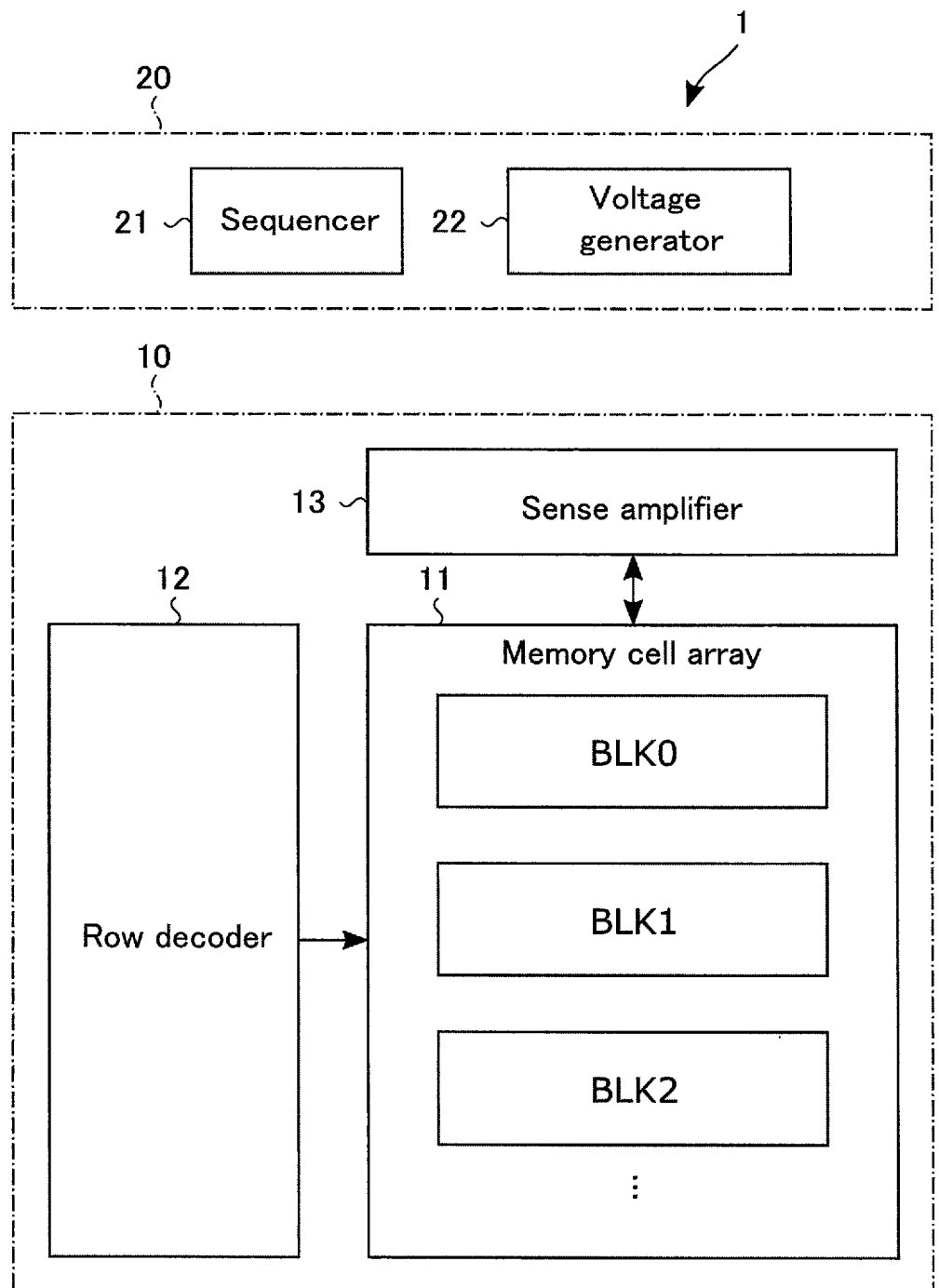
FIG. 1 is a block diagram of a semiconductor memory device according to a first embodiment.

First, an overall configuration of the semiconductor memory device will be explained with reference to FIG. 1. FIG. 1 is a block diagram showing a configuration of the semiconductor memory device. In FIG. 1, some of the couplings between the blocks are indicated by arrows; however, the couplings between the blocks are not limited to those shown in FIG. 1.

As shown in FIG. 1, the semiconductor memory device 1 includes a memory core part 10 and peripheral circuitry 20.

The memory core part 10 includes a memory cell array 11, a row decoder 12, and a sense amplifier 13.

The memory cell array 11 includes a plurality of blocks BLK. In the example shown in FIG. 1, three blocks BLK0 through BLK2 are shown; however, the number of the blocks is not limited to three. The blocks BLK are associated with interconnects extending in a row direction and a column direction, and include a plurality of three-dimensionally arranged memory cell transistors.

The row decoder 12 decodes a row address received from an external controller (not shown). The row decoder 12 selects a row direction of the memory cell array 11 based on a result of the decoding. More specifically, the row decoder 12 applies voltages to the interconnects for selecting a row direction.

The sense amplifier 13 senses data from any of the blocks BLK when a data read is performed. When a data write is performed, the sense amplifier 13 applies a voltage to the memory cell array 11 in accordance with write data.

The peripheral circuitry 20 includes a sequencer 21 and a voltage generator 22.

The sequencer 21 controls the operation of the entire semiconductor memory device 1. More specifically, the sequencer 21 controls a voltage generator 22, a row decoder 12, and a sense amplifier 13, etc., when a write operation, a read operation, or an erase operation is performed based on instructions from an external controller.

The voltage generator 22 generates voltages necessary for a write operation, a read operation, and an erase operation, and supplies the voltages to the row decoder 12 and the sense amplifier 13, etc.

1.1.2 Circuitry Configuration of Memory Cell Array

Figure 2:
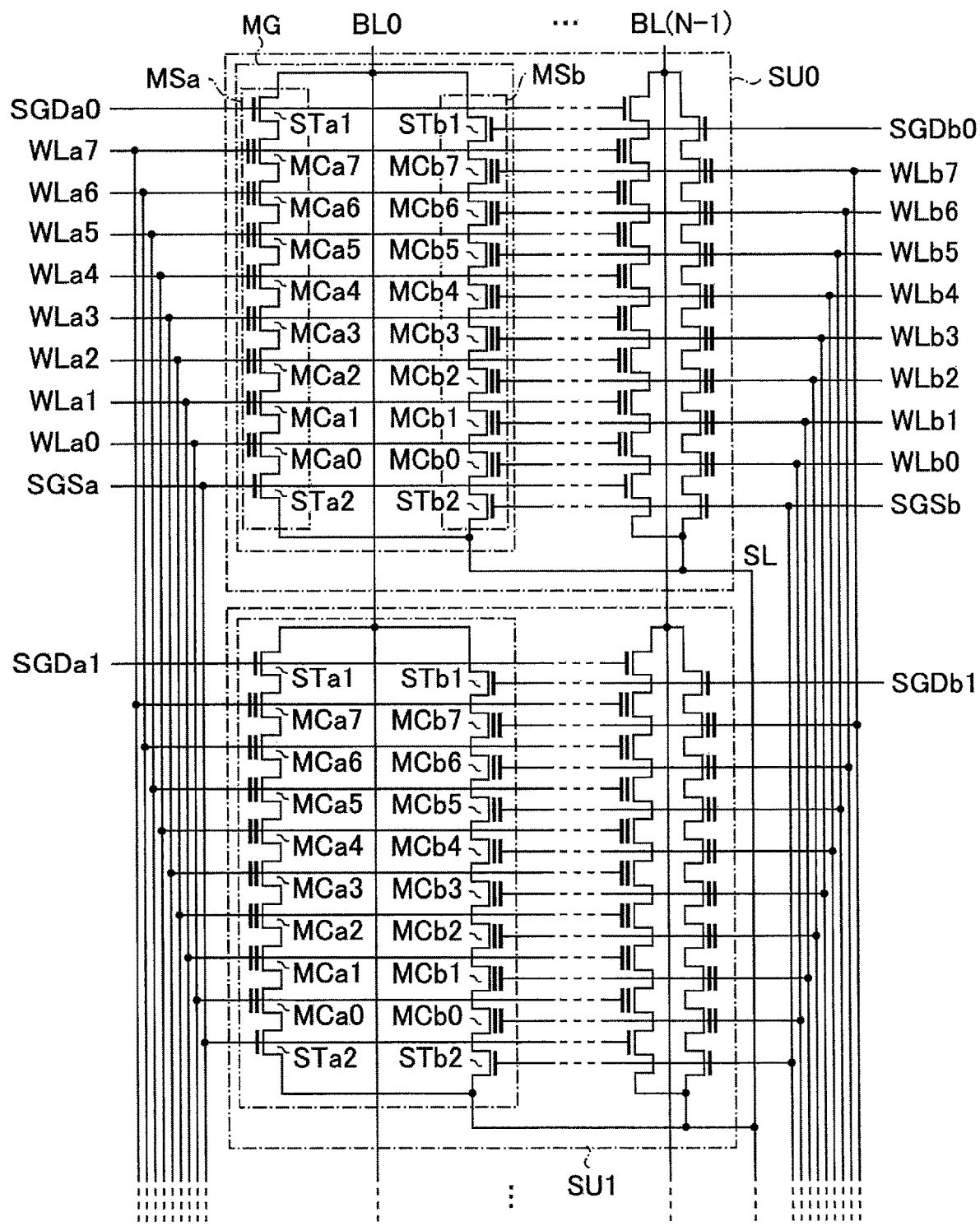
FIG. 2 is a circuit diagram of a memory cell array included in the semiconductor memory device according to the first embodiment.

Next, the circuitry configuration of the memory cell array 11 will be described with reference to FIG. 2. FIG. 2 is a circuit diagram of the memory cell array 11 in one block BLK. As shown in FIG. 2, a block BLK includes a plurality of string units SU (SU0, SU1 . . . ). Each string unit SU includes a plurality of memory groups MG. Each memory group MG includes two memory strings MSa and MSb coupled to each other in parallel. Hereinafter, memory strings MSa and MSb will be referred to as memory string MS, unless specified.

Memory string MSa includes eight memory cell transistors MCa0 to MCa7 and select transistors STa1 and STa2, for example. Similarly, memory string MSb includes eight memory cell transistors MCb0 to MCb7 and select transistors STb1 and STb2. Hereinafter, memory cell transistors MCa0 to MCa7 and MCb0 to MCb7 will be referred to as memory cell transistors MC, unless specified. Select transistors STa1 and STb1 will be referred to as select transistors ST1, and select transistors STa2 and STb2 are referred to as select transistors ST2, unless specified.

Each memory cell transistor MC includes a control gate and a charge storage layer, and stores data in a non-volatile manner Each memory cell transistor MC may be of a MONOS (metal-oxide-nitride-oxide silicon) type that uses an insulating layer as the charge storage layer, or may be of an FG (floating gate) type that uses a conductive layer as the charge storage layer. In the present embodiment, a MONOS type memory cell transistor will be described as an example. The number of memory cell transistors MC included in each memory string MS may be 16, 32, 48, 64, 96, 128, etc., and the number is not limited to these numbers. Furthermore, the number of select transistors ST1 and ST2 included in each memory string MS can be determined as appropriate, as long as one select transistor ST1 and one select transistor ST2 are included.

The memory cell transistors MC and the select transistors ST1 and ST2 included in each memory string MS are coupled in series. More specifically, in memory string MSa, the current paths of select transistor STa2, memory cell transistors MCa0 through MCa7, and select transistor STa1 are coupled in series in order. Similarly, in memory string MSb, the current paths of select transistor STb2, memory cell transistors MCb0 through MCb7, and select transistor STb1 are coupled in series in order. The drains of select transistor STa1 and select transistor STb1 included in one memory group MG are coupled in common to any of a plurality of bit lines BL (BL0, . . . , BL(N−1), herein (N−1) is an integer equal to or greater than 2). The plurality of bit lines BL are independently controlled by the sense amplifier 13. The sources of select transistor STa2 and select transistor STb2 included in one memory group MG are coupled in common to source line SL.

In the string unit SU, the gates of the plurality of select transistors STa1 are coupled in common to select gate line SGDa, and the gates of the plurality of select transistors STb1 are coupled in common to select gate line SGDb. More specifically, in string unit SU0, the gates of the plurality of select transistors STa1 are coupled in common to select gate line SGDa0, and the gates of the plurality of select transistors STb1 are coupled in common to select gate line SGDb0. Similarly, in string unit SU1, the gates of the plurality of select transistors STa1 are coupled in common to select gate line SGDa1, and the gates of the plurality of select transistors STb1 are coupled in common to select gate line SGDb1. Hereinafter, select gate lines SGDa and SGDb will be referred to as select gate lines SGD, unless specified. Each select gate line SGD is independently controlled by the row decoder 12.

In each block BLK, the gates of a plurality of the select transistors STa2 are coupled in common to select gate line SGSa, and the gates of a plurality of the select transistors STb2 are coupled in common to select gate line SGSb. Select gate lines SGSa and SGSb may be coupled in common to the row decoder 12, for example, and may be independently controlled by the row decoder 12. Hereinafter, select gate lines SGSa and SGSb will be referred to as select gate lines SGS, unless specified.

In each block BLK, the control gates of a plurality of memory cell transistors MCa0 through MCa7 and MCb0 through MCb7 are respectively coupled in common to word lines WLa0 through WLa7 and WLb0 through WLb7 provided in each block BLK. Word lines WLa0 through WLa7 and WLb0 through WLb7 are independently controlled by the row decoder 12. Hereinafter, word lines WLa and WLb will be referred to as word lines WL, unless specified.

A block BLK is a unit of data erasure, for example, and data stored in memory cell transistors MC included in a block BLK is erased in a batch. Each of a write operation and a read operation is performed to the entire memory cell transistors MC coupled to one word line WL of one string unit SU in common.

In the memory cell array 11, the drains of select transistors STa1 and STb1 in a plurality of memory groups MG arranged in the same row are coupled to one bit line BL in common. In other words, the memory groups MG of respective string units SU are coupled to a bit line BL in common. The string unit SU includes a plurality of memory groups MG coupled to different bit lines BL and coupled to the same select gate lines SGD. The block BLK includes a plurality of string units SU sharing the word lines WL. The memory cell array 11 includes a plurality of blocks BLK sharing the bit lines BL. In the memory cell array 11, the select gate lines SGS, the word lines WL, and the select gate lines SGD are stacked above the semiconductor substrate; accordingly, the memory cell transistors MC are three-dimensionally stacked.

1.1.3 Planar Configuration of Memory Cell Array

Figure 3:
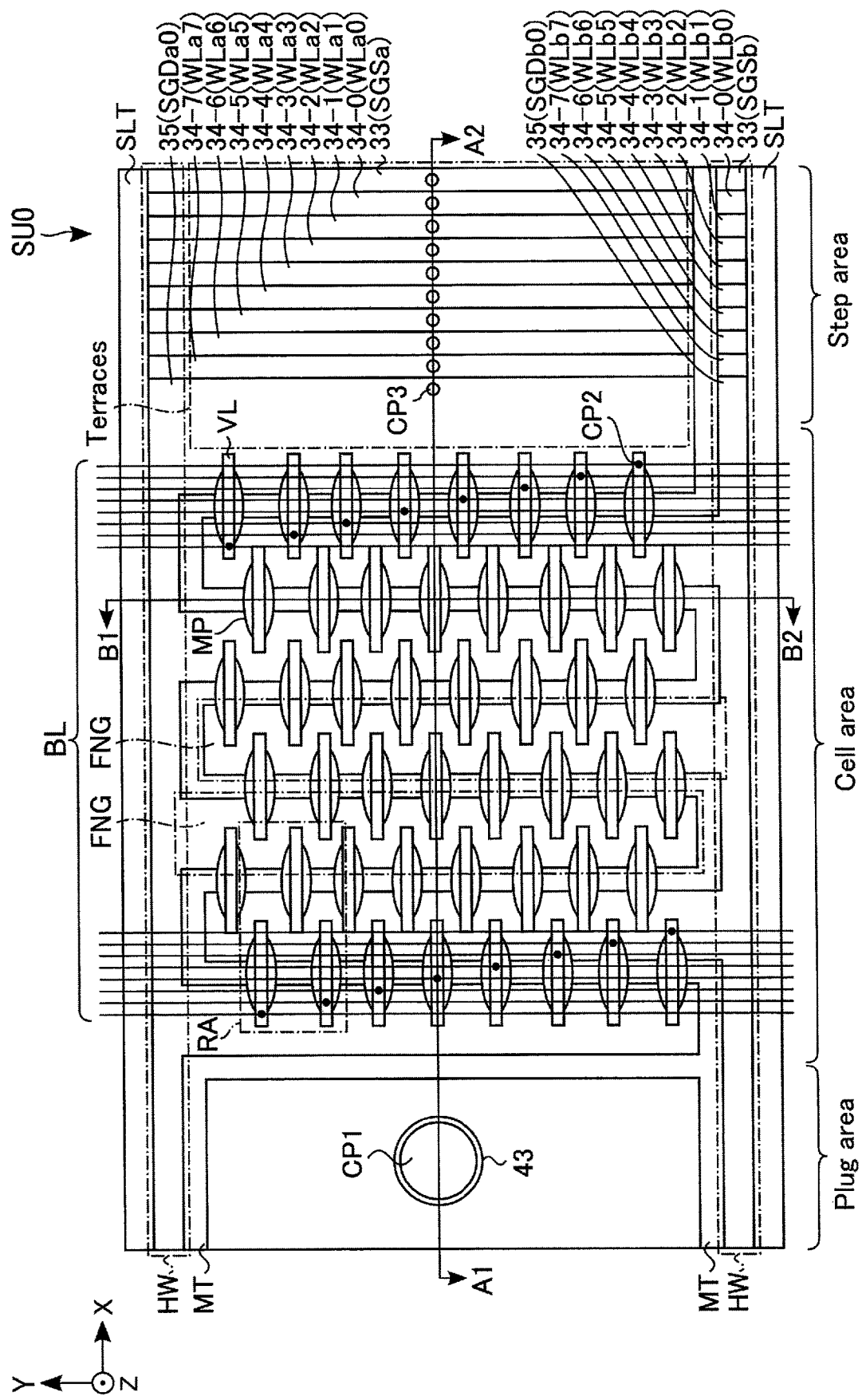
FIG. 3 is a plan view of the memory cell array included in the semiconductor memory device according to the first embodiment.
Figure 4:
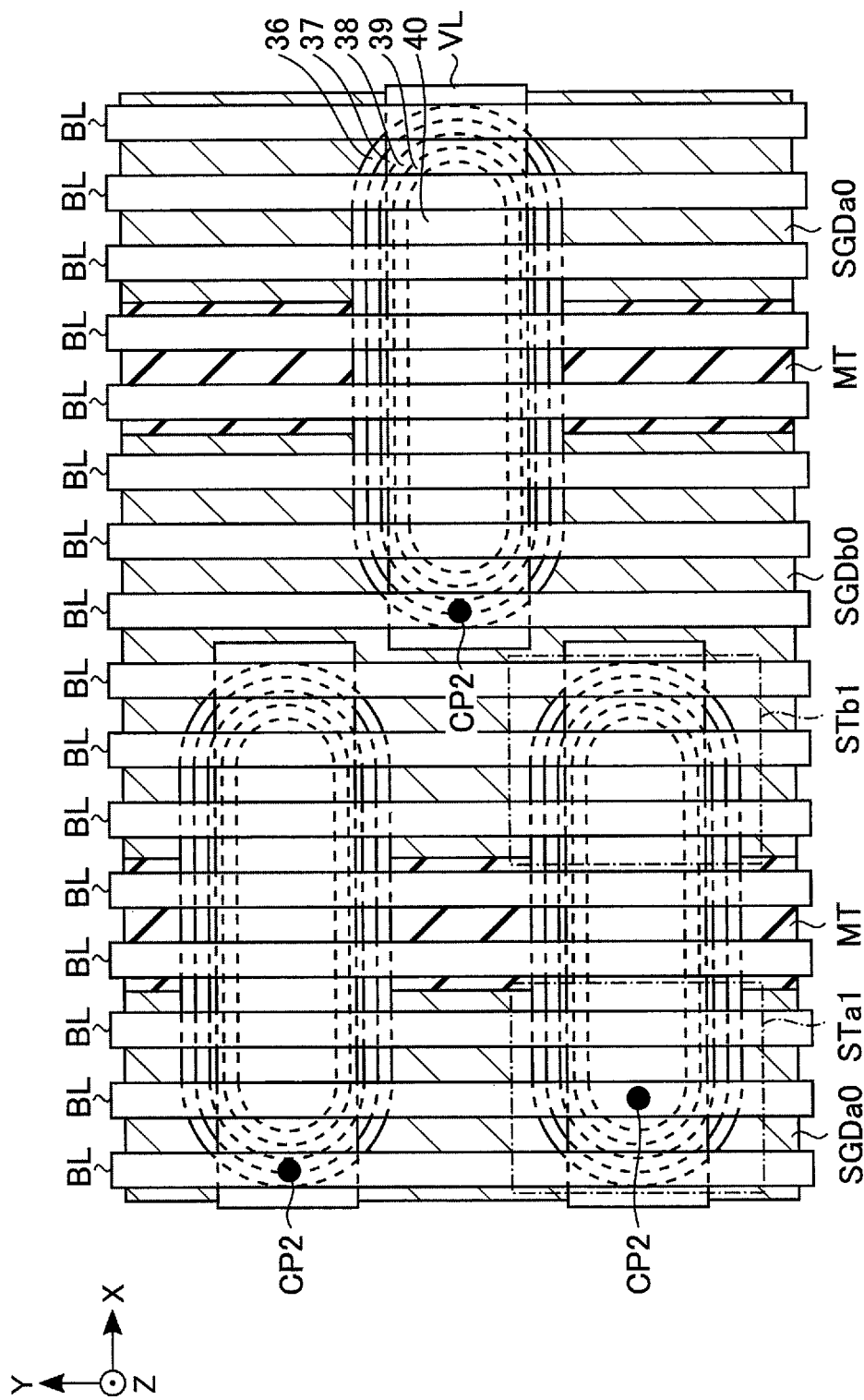
FIG. 4 is a plan view of a region RA shown in FIG. 3.

Next, a planar configuration of the memory cell array 11 will be described with reference to FIGS. 3 and 4. FIG. 3 is a plan view showing a part of string unit SU0. FIG. 4 is an enlarged view of region RA shown in FIG. 3. In the example shown in FIG. 3, some of the bit lines BL and intra-layer insulating films are omitted, and in the example shown in FIG. 4, the intra-layer insulating films are omitted.

As shown in FIG. 3, within the cell array, string unit SU0 includes an area (hereinafter, "plug area") in which contact plug CP1 is provided to contact an interconnect provided above the cell array and an interconnect provided below the cell array, a cell area, and a step area. More specifically, the step area, the cell area, and the plug area are arranged in order, from one end of string unit SU0 to the other end, along the X-axis direction parallel to the semiconductor substrate. The step area may be provided on both sides of the string unit SU, and a plurality of the cell areas and the plug areas may be provided along the X-axis direction.

In the memory cell array 11, an interconnect layer 33 that functions as a select gate line SGS, interconnect layers 34-0 through 34-7 that function as word lines WL0 through WL7, and an interconnect layer 35 that functions as select gate line SGD are stacked in the Z-axis direction which is perpendicular to the semiconductor substrate. Furthermore, each of the interconnect layers is divided into two by a memory trench MT filled with an insulating material. More specifically, the interconnect layer 35 for example is divided into two by the memory trench MT, and functions as select gate lines SGDa0 and SGDb0. Similarly, each of the interconnect layers 34-0 through 34-7 is divided into two by the memory trench MT, and functions as word lines WLa0 through WLa7 and WLb0 through WLb7. The interconnect layer 33 is divided into two by the memory trench MT, and functions as select gate lines SGSa and SGSb.

Each of the interconnect layers 33, 34-0 through 34-7, and 35 includes electrode HW that extends in the X-axis direction and that is interposed between a slit SLT that separates one block from another and the memory trench MT, and a plurality of electrodes FNG each surrounded by the memory trench MT extending in the Y-axis direction which is parallel to the semiconductor substrate and perpendicular to the X-axis direction.

The electrodes HW are provided in the sides of the string unit SU extending in the X-axis direction. More specifically, in the example shown in FIG. 3, electrode HW of select gate line SGDa0 is provided in one side (shown in the top of the drawing sheet) of string unit SU0 extending in the X-axis direction, and electrode HW of select gate line SGDb0 is provided in the other side (shown in the bottom of the drawing sheet) of string unit SU0 extending in the X-axis direction.

The plurality of electrodes FNG are provided in the cell area. Electrode FNG is a plate arranged in parallel to the semiconductor substrate, and one end in the Y-axis direction is coupled to electrode HW, and the other end is isolated from neighboring electrode HW by the memory trench MT. More specifically, in the X-axis direction, the plurality of electrodes FNG corresponding to select gate line SGDa0 and the plurality of electrodes FNG corresponding to select gate line SGDb0 are isolated by the memory trench MT and they are alternately coupled to electrodes HW shown in the top and bottom of the drawing sheet. In other words, the electrodes FNG of select gate line SGDa0 and the electrodes FNG of select gate line SGDb0 are alternately arranged in the X-axis direction. The interconnect layers 33 and 34-0 through 34-7, i.e., select gate line SGS and word lines WL0 through WL7, are also arranged in a similar manner. Accordingly, the memory trench MT has a shape of a square wave extending in the X-axis direction in the cell area.

In the cell area, a plurality of memory pillars MP respectively corresponding to the memory groups MG are formed so as to divide the memory trench MT. The structure of the memory pillars MP will be described later in detail. In the example shown in FIG. 3, the long axis of the oval-shaped memory pillar MP orthogonally intersects the memory trench MT. The memory pillars MP are separated each other by the memory trench MT. The memory pillars MP are arranged in eight rows along the Y-axis direction. Columns of the eight memory pillars MP intersecting the memory trench MT are arranged in a staggered manner along the X-axis direction.

An interconnect layer VL electrically coupled to each memory pillar MP is formed above the memory pillar MP. A plurality of bit lines BL extending in the Y-axis direction are provided above the interconnect layers VL, and each interconnect layer VL is electrically coupled to one of the bit lines BL via contact plug CP2. More specifically, eight bit lines BL extending in the Y-axis direction are arranged above eight memory pillars MP arranged along the Y-axis direction, in other words, eight interconnect layers VL. The eight interconnect layers VL are respectively coupled to the bit lines BL via contact plug CP2.

In the plug area, a plurality of contact plugs CP1 are formed in an internal area surrounded by the memory trench MT. The outer side surface of contact plug CP1 is covered with an insulating layer 43. Contact plug CP1 passes through the memory cell array 11, and electrically couples an interconnect (not shown) provided above the memory cell array 11 and a circuit (not shown) provided below the memory cell array 11 (for example, the row decoder 12 or the sense amplifier 13). Since the plug area is isolated from the slit SLT by being surrounded by the memory trench MT, the plug area is not to be metal-replaced. Accordingly, even if contact plug CP1 is formed in this area, the contact plug CP1 will not be in electrical contact with the word lines WL and select gate lines SGD and SGS. The number of contact plugs CP1 arranged in the internal area can be determined as appropriate. The outer area that is not surrounded by the memory trench MT in the plug area, in other words, the interconnect layers 33, 34-0 through 34-7, and 35 in the sides of string unit SU0 extending in the X-axis direction are brought into a conductive state by a replacement process, which will be described later, from the slit SLT side, and the areas serve as electrodes HW.

In the step area, the ends of the interconnect layers 33, 34-0 through 34-7, and 35 are drawn out in a stepwise manner along the X-axis direction (hereinafter, each drawn-out end will be called a "terrace"). Each terrace is coupled to its corresponding electrode HW. In other words, electrodes HW couple the terraces with electrodes FNG. FIG. 3 shows an example in which the terraces corresponding to select gate line SGSa, word lines WLa0 through WLa7, and select gate line SGDa0 are formed in one end of string unit SU0, and the terraces corresponding to select gate line SGSb, word lines WLb0 through WLb7, and select gate line SGDb0 are formed in the not-shown other end of string unit SU0. On each terrace, contact plug CP3 is formed. In other words, the terrace functions as a unit to be coupled to contact plug CP3. Contact plug CP3 electrically couples each terrace with upper-layer interconnects (not shown). For example, the upper end of contact plug CP3 is coupled to the row decoder 12, which is formed below the memory cell array 11, via the interconnect layers formed above the memory cell array 11 and contact plug CP1.

Two slits SLT extending in the X-axis direction are provided in such a manner that the slits are respectively in contact with two sides of string unit SU0 extending in the X-axis direction. The slits SLT are filled with an insulating material, and the sides of the slits SLT are in contact with the interconnect layers 33, 34-0 through 34-7, and 35.

Next, the memory pillars MP and the interconnect layer VL will be described in detail. As shown in FIG. 4, the memory trench MT and the memory pillars MP are formed between select gate line SGDa0 and select gate line SGDb0 extending in the Y-axis direction. On the inner side surface of the memory pillar MP, a block insulating film 36, a charge storage layer 37, a tunnel insulating film 38, and a semiconductor layer 39 are formed in order, and the inside of the memory pillar MP is filled with a core layer 40. The interconnect layer VL electrically coupled to the semiconductor layer 39 is formed above the memory pillar MP. Contact plug CP2 is formed on the interconnect layer VL, and the interconnect layer VL is coupled to one bit line BL via the contact plug CP2.

The plurality of memory pillars MP arranged along the Y-axis direction are coupled to bit lines BL, respectively. For this reason, if, for example, eight memory pillars MP are arranged in the Y-axis direction, at least eight bit lines BL are arranged above the memory pillars MP. Accordingly, a diameter of the memory pillar MP in the X-axis direction is dependent on an interconnect width and an interconnect interval of the bit lines BL. In contrast, it is preferable to set a diameter of the memory pillar MP in the Y-axis direction smaller, so that an increase in size of the string unit SU can be suppressed. For this reason, it is preferable to form the memory pillar MP in an oval shape in which the diameter in the Y-axis direction in which the bit lines BL extend is shorter than the diameter in the X-axis direction. In order to reserve a sufficient area for coupling the interconnect layer VL to contact plug CP2 even in the end of the memory pillar MP in the X-axis direction, it is preferable to set the length of the interconnect layer VL in the X-axis direction longer than a diameter of the memory pillar MP in the X-axis direction.

For example, the area including select gate line SGDa0, and a part of each of the block insulating film 36 that is in contact with select gate line SGDa0, the charge storage layer 37, the tunnel insulating film 38, and the semiconductor layer 39 of the memory pillar MP function as select transistor STa1. The area including select gate line SGDb0, and a part of each of the block insulating film 36 that is in contact with select gate line SGDb0, the charge storage layer 37, the tunnel insulating film 38, and the semiconductor layer 39 of the memory pillar MP functions as select transistor STb1. The same is true of the word lines WL and the select gate lines SGS arranged in the lower layers of select gate line SGD. The area including word line WLa7 arranged in a lower layer of select gate line SGDa0, and a part of each of the block insulating film 36 that is in contact with word line WLa7, the charge storage layer 37, the tunnel insulating film 38, and the semiconductor layer 39 of the memory pillar MP function as memory cell transistor MCa7, that is, a storage. Similarly, the area including word line WLb7 arranged in a lower layer of select gate line SGDb0, and a part of each of the block insulating film 36 that is in contact with word line WLb7, the charge storage layer 37, the tunnel insulating film 38, and the semiconductor layer 39 of the memory pillar MP functions as memory cell transistor MCb7. The same is true of the other word lines (WLa0 through WLa6 and WLb0 through WLb6).

1.1.4 Cross-Sectional Configuration of Memory Cell Array

Next, a cross-sectional configuration of the memory cell array 11 will be described with reference to FIGS. 5 and 6.

Figure 5:
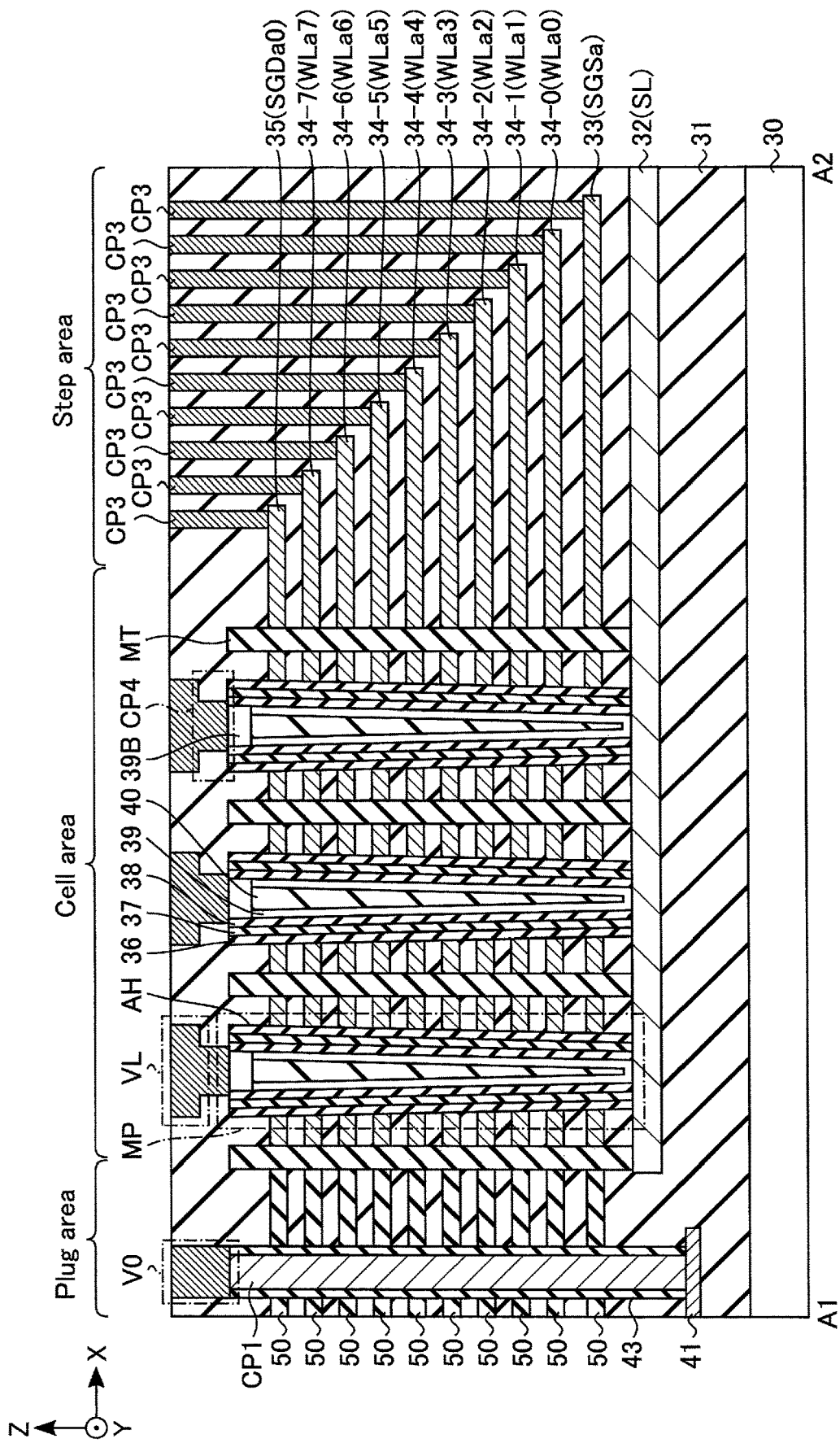
FIG. 5 is a sectional view of the memory cell array, taken along line A1-A2 shown in FIG. 3.

FIG. 5 is a sectional view of the memory cell array 11, taken along line A1-A2 shown in FIG. 3. FIG. 6 is a sectional view of the memory cell array 11, taken along line B1-B2 shown in FIG. 3. To simplify the description, contact plugs CP2 and the bit lines BL are omitted in the examples shown in FIGS. 5 and 6.

As shown in FIG. 5, an insulating layer 31 is formed on the semiconductor substrate 30. For the insulating layer 31, a silicon oxide film ($SiO_2$) is used, for example. In the insulating layer 31, transistors (not shown) and a plurality of interconnect layers (not shown) formed on the semiconductor substrate 30 are included. The interconnect layer 41 is an uppermost interconnect layer among the plurality of interconnect layers. The memory cell array 11 is formed on the insulating layer 31. More specifically, in the example of FIG. 5, the interconnect layer 32 that functions as a source line is formed on the insulating layer 31 in the cell area and the step area. The interconnect layer 32 is made of a conductive material, and as the conductive material, a metallic material, such as tungsten (W) or titanium nitride (TiN), or a semiconductor, such as Si, may be used. On the interconnect layer 32, the interconnect layer 33 that functions as select gate line SGS, the interconnect layers 34-0 through 34-7 that function as word lines WL0 through WL7, and the interconnect layer 35 that functions as select gate line SGD are stacked, with the insulating layer 31 being interposed therebetween. In other words, the interconnect layers 33, 34-0 through 34-7, and 35 are arranged with a space therebetween in the Z-axis direction. The interconnect layers 33, 34-0 through 34-7, and 35 are made of a conductive material, and a metallic material, such as tungsten (W) and titanium nitride (TiN), or a semiconductor, such as Si, may be used as the conductive material. Hereinafter, an example where W and TiN are used for the interconnect layers 33, 34-0 through 34-7, and 35 will be explained in the present embodiment. TiN functions as a barrier layer or an adhesion layer when W is formed.

In the cell area, the memory pillars MP that pass through the interconnect layers 33, 34-0 through 34-7, and 35 and are in contact with the interconnect layer 32 at their bottom surfaces, and the memory trench MT are alternately formed along the X-axis direction. The memory pillar MP is formed inside a hole AH. More specifically, in the cell area, in order to form the memory pillars MP, the holes AH that pass through the interconnect layers 33, 34-0 through 34-7, and 35 and have a bottom surface being in contact with the interconnect layer 32 are formed in the cell area. In the inner side surface of each hole AH, the block insulating film 36, the charge storage layer 37, and the tunnel insulating film 38 are laminated in order. In the hole AM, a semiconductor layer 39, which is in contact with the tunnel insulating film 38 at its side surface and in contact with the interconnect layer 32 at its bottom surface, is formed, and the inside of the semiconductor layer 39 is filled with the core layer 40. On the semiconductor layer 39 and the core layer 40, a semiconductor layer 39B is formed as a cap layer. For the block insulating film 36, the tunnel insulating film 38, and the core layer 40, $SiO_2$ is used, for example. For the charge storage layer 37, a silicon nitride film (SiN) is used, for example. For the semiconductor layers 39 and 39B, polycrystalline (poly-Si) is used, for example.

On each memory pillar MP, contact plug CP4 electrically coupled to the semiconductor layer 39B is formed, and an interconnect layer VL is formed on contact plug CP4. Contact plug CP4 and the interconnect layer VL are made of a conductive material. In the present embodiment hereinafter, a case where contact plug CP4 and the interconnect layer VL are integrally made of titanium (Ti), TiN, and W. For example, Ti is used to form a silicide layer in the interface with the semiconductor layer 39B and to reduce a resistance value in the interface with the semiconductor layer 39B.

The memory trench MT extends in the Y-axis direction, and the inside thereof is filled with $SiO_2$, for example.

In the plug area, ten sacrificial layers 50 used to form the interconnect layers 33, 34-0 through 34-7, 35, and 42 are stacked with a space interposed therebetween in the Z-axis direction. Furthermore, in the plug area, contact plug CP1 that passes through the ten sacrificial layers 50 is formed. The bottom surface of contact plug CP1 is in contact with the interconnect layer 41 formed in a lower layer of the interconnect layer 32, and the outer side surface of contact plug CP1 is covered with the insulating layer 43. For the insulating layer 43, $SiO_2$ is used, for example. For the sacrificial layers 50, SiN is used, for example. The SiN used for the sacrificial layers 50 in the plug area is not etched even during the replacement process, which will be described later.

The sacrificial layers 50 in the plug area may be however replaced. In this case, the insulating layer 43 prevents contact plug CP1 from being electrically coupled to the replaced interconnect layer.

The interconnect layer 41 is coupled to a not-shown circuit, e.g., the row decoder 12 or the sense amplifier 13, etc. As described above, the interconnect layer 41 is located below the memory cell array 11, and is an interconnect layer of a peripheral circuit (not shown) formed on the semiconductor substrate 30. The height position of the bottom surface of contact plug CP1 is lower than that of the bottom surface of the interconnect layers 32, and the height position of the top surface of contact plug CP1 is higher than the top surface of the interconnect layer 35. Contact plug CP1 is made of a conductive material, and a metallic material, such as W, Ti, or TiN, or a semiconductor, such as Si, may be used as the conductive material. On contact plug CP1, contact plug V0 is formed so as to couple contact plug CP1 to a not-shown interconnect in an upper layer. Contact plug V0 is made of a conductive material. Hereinafter, in the present embodiment, an example where Ti, TiN, and W are used as contact plug V0 will be explained.

In the step area, the terraces are formed by drawing out the interconnect layers 33, 34-0 through 34-7, and 35 in a stepwise manner in the X-axis direction. On each terrace, contact plug CP3 is formed. Contact plug CP3 is made of a conductive material. In the following, in the present embodiment, an example in which W and TiN are used as contact plug CP3 will be explained.

Figure 6:
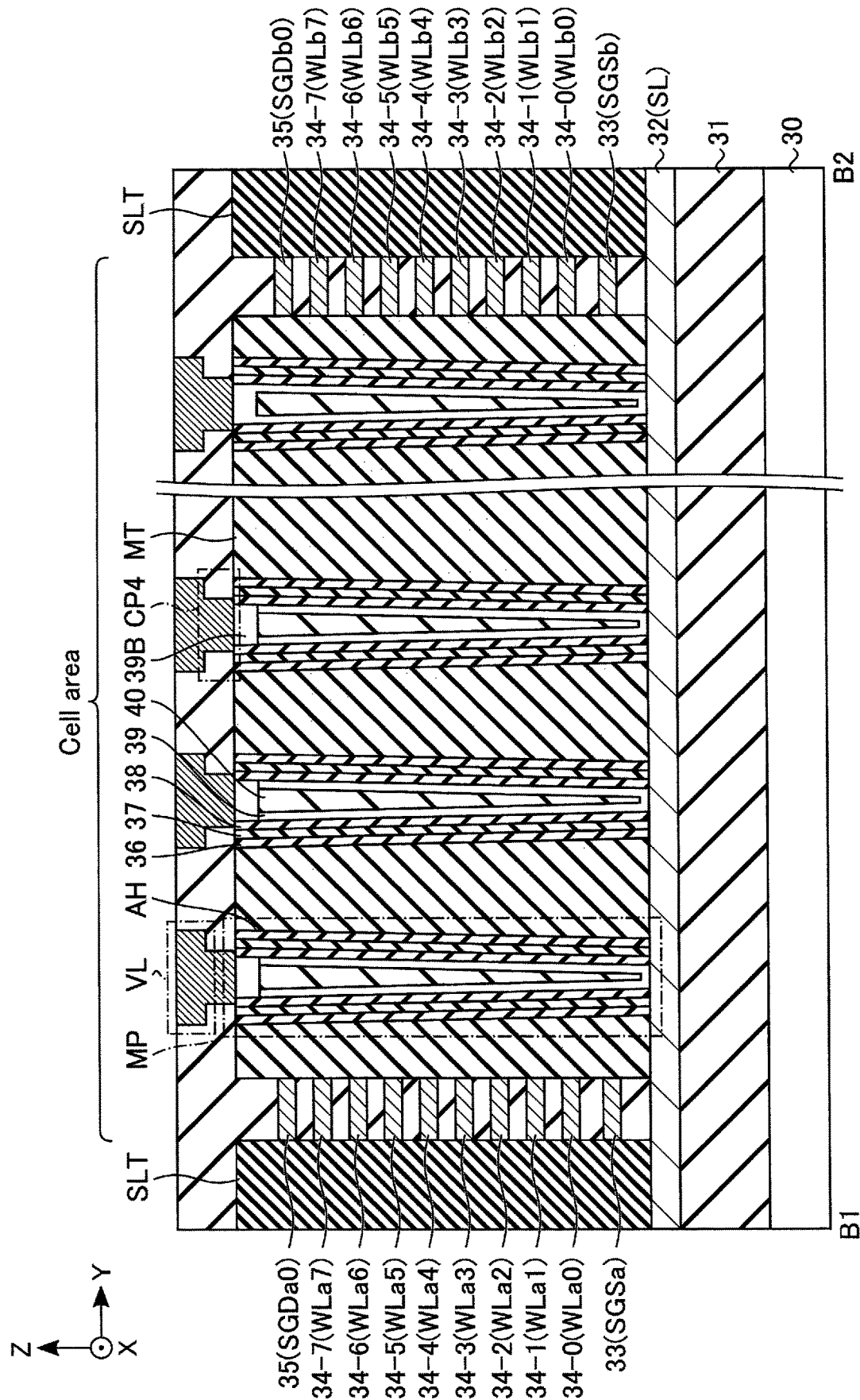
FIG. 6 is a sectional view of the memory cell array, taken along line B1-B2 shown in FIG. 3.

As shown in FIG. 6, in the cell area, the memory trench extending MT in the Y-axis direction is divided by the memory pillars MP. In the example shown in FIG. 6, the interconnect layers 33, 34-0 through 34-7, and 35 arranged on the left side of the drawing sheet with respect to the memory trench MT function as select gate line SGSa, word lines WLa0 through WLa7, select gate line SGDa0, respectively. Similarly, the interconnect layers 33, 34-0 through 34-7, and 35 arranged on the right side of the drawing sheet with respect to the memory trench MT function as select gate line SGSb, word lines WLb0 through WLb7, select gate line SGDb0, respectively.

Slits SLT extending in the X-axis direction are formed in the sides of the string unit SU in the Y-axis direction. The bottom surface of the slit SLT reaches the upper surface of the interconnect layer 32. The side surfaces of the interconnect layers 33, 34-0 through 34-7, and 35 are respectively in contact with the side surface of the slit SLT. The inside of the slit SLT is filled with $SiO_2$, for example.

1.2 Method of Forming Memory Cell Array

Next, a method of forming the memory cell array 11 will be explained with reference to FIGS. 7-15. Each of FIGS. 7-15 shows the plane of string unit SU0 explained with reference to FIGS. 3, 5, and 6, the cross section taken along line A1-A2 (hereinafter, the A1-A2 cross section), and the cross section taken along line B1-B2 (hereinafter, the B1-B2 cross section).

In the following description of the present embodiment, a method of forming the interconnect layers 33, 34-0 through 34-7, and 35 by filling gaps, which are formed by removing the sacrificial layers 50, with a conductive material (hereinafter, "replacement"), will be explained. In the following example, SiN is used for the sacrificial layers 50, and a multi-layered film made of W or TiN is used as a conductive material. The material of the sacrificial layers 50 is not limited to SiN. For example, the sacrificial layers 50 may be made of a silicon oxynitride (SiON) film, or any material, as long as the material can obtain a sufficient selection ratio in wet etching between the material and the insulating layer 31 which is made of, for example, $SiO_2$. Furthermore, a plurality of dummy pillars HR (not shown) may be arranged in the step area. The dummy pillars HR are in an electrically non-conductive state, and they are formed as supports for protecting the gaps formed by removing the sacrificial layers 50.

Figure 7:
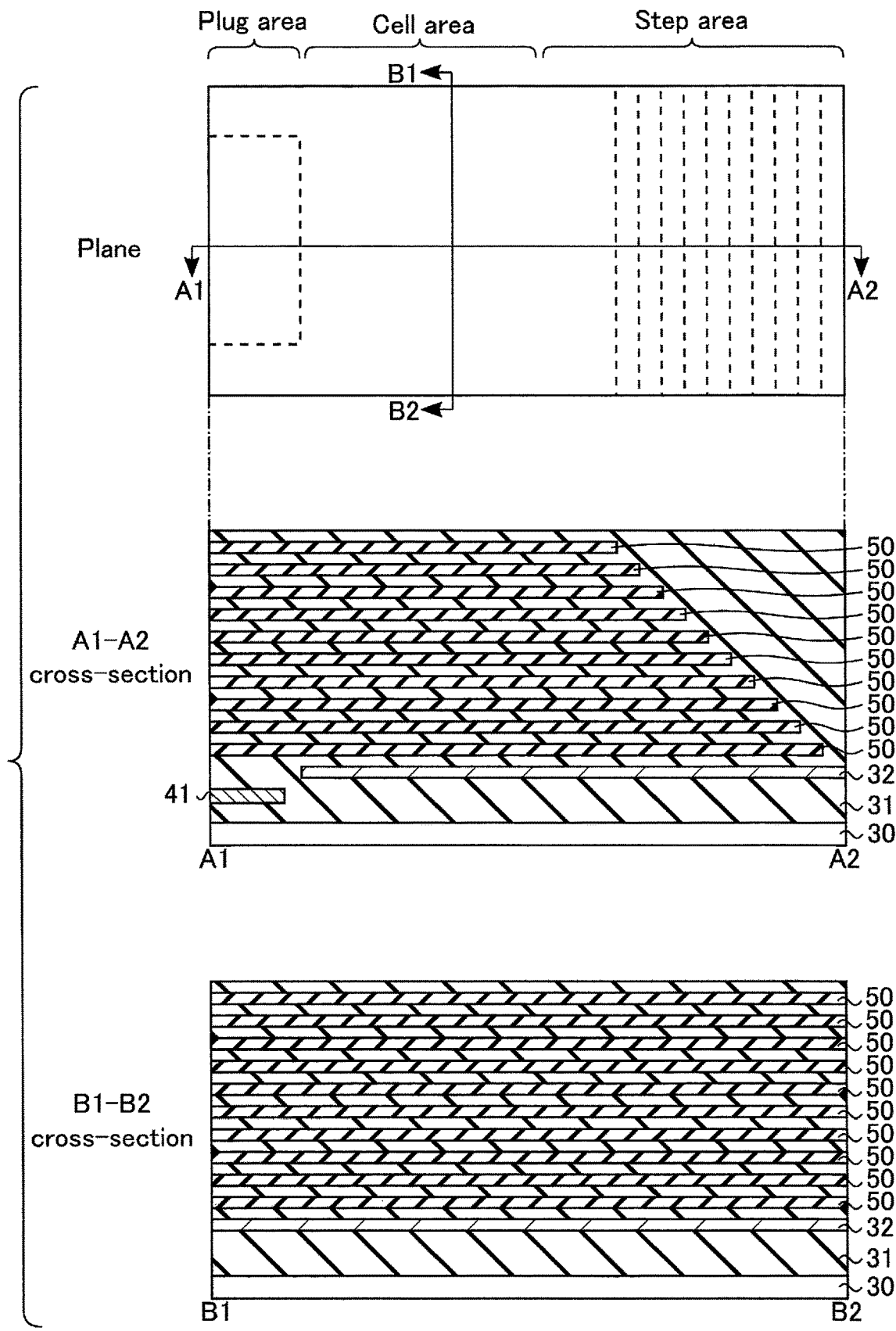
FIGS. 7-15 are diagrams showing a process of manufacturing the semiconductor memory device according to the first embodiment.

As shown in FIG. 7, the interconnect layer 41 is formed above the semiconductor substrate 30, with the insulating layer 31 being interposed therebetween. After forming the insulating layer 31 above the interconnect layer 41, the interconnect layer 32 is formed. Next, ten sacrificial layers 50 corresponding to the interconnect layers 33, 34-0 through 34-7, and 35 are formed above the interconnect layer 32, with the insulating layer 31 being interposed therebetween. At this time, the ten sacrificial layers 50 are made in a stepwise manner in the step area. Then, the insulating layer 31 is further formed above the uppermost sacrificial layer 50, and the surface is polished by, for example, chemical mechanical polishing (CMP).

Figure 8:
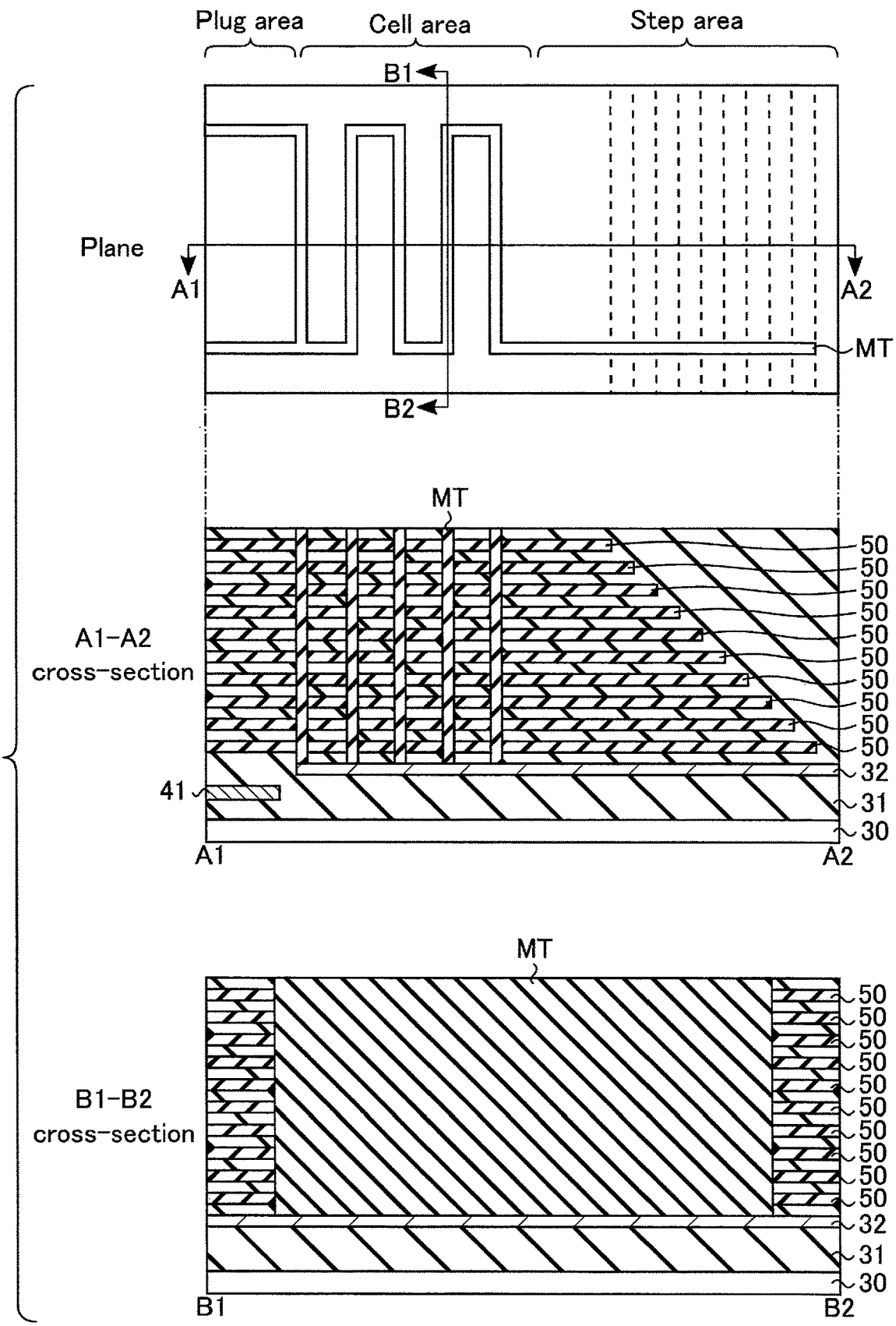

As shown in FIG. 8, after forming the memory trench MT that reaches the interconnect layer 32 with its bottom surface, the inside of the memory trench MT is filled with $SiO_2$.

Figure 9:
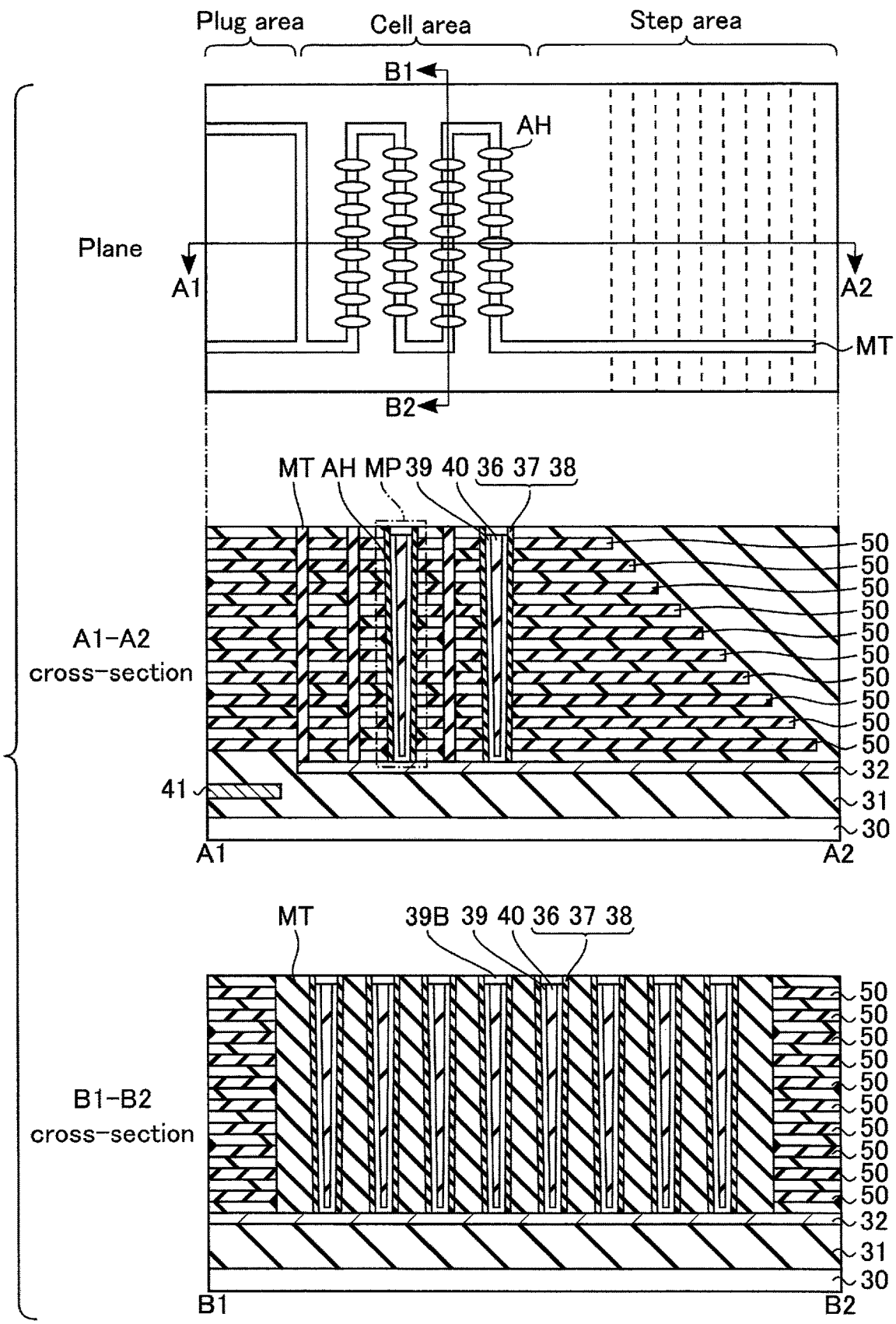

As shown in FIG. 9, the memory pillars MP are formed. More specifically, holes AH that reach the interconnect layer 32 with their bottom surfaces are first made. Next, the block insulating film 36, the charge storage layer 37, and the tunnel insulating film 38 are laminated in order. Next, the block insulating film 36, the charge storage layer 37, and the tunnel insulating film 38 on the bottom surface of each hole AH and on the insulating layer 31 (in other words, on the top surface of the insulating layer 31) are removed by dry etching, thereby forming a lamination structure consisting of the block insulating film 36, the charge storage layer 37, and the tunnel insulating film 38 on the inner side surface of the hole AH. Next, the semiconductor layer 39 and the core layer 40 are laminated in order, thereby temporarily filling in the hole AH. Next, the core layer 40 on the top surface and a part of the core layer 40 in the hole AH are removed. Herein, a dimple is formed in the hole AH. Next, the dimple is filled with the semiconductor layer 39B, and excess semiconductor layer 39B on the surface is removed once again, thereby forming a cap made of the semiconductor layer 39B only on the core layer 40. A cap may be not necessarily formed. The method of forming the memory trench MT and the holes AH is not limited to the above-described methods; for example, the memory trench MT may be formed by first forming the holes AH and then forming the memory trench MT in such a manner that the memory trench MT divides the holes AH.

Figure 10:
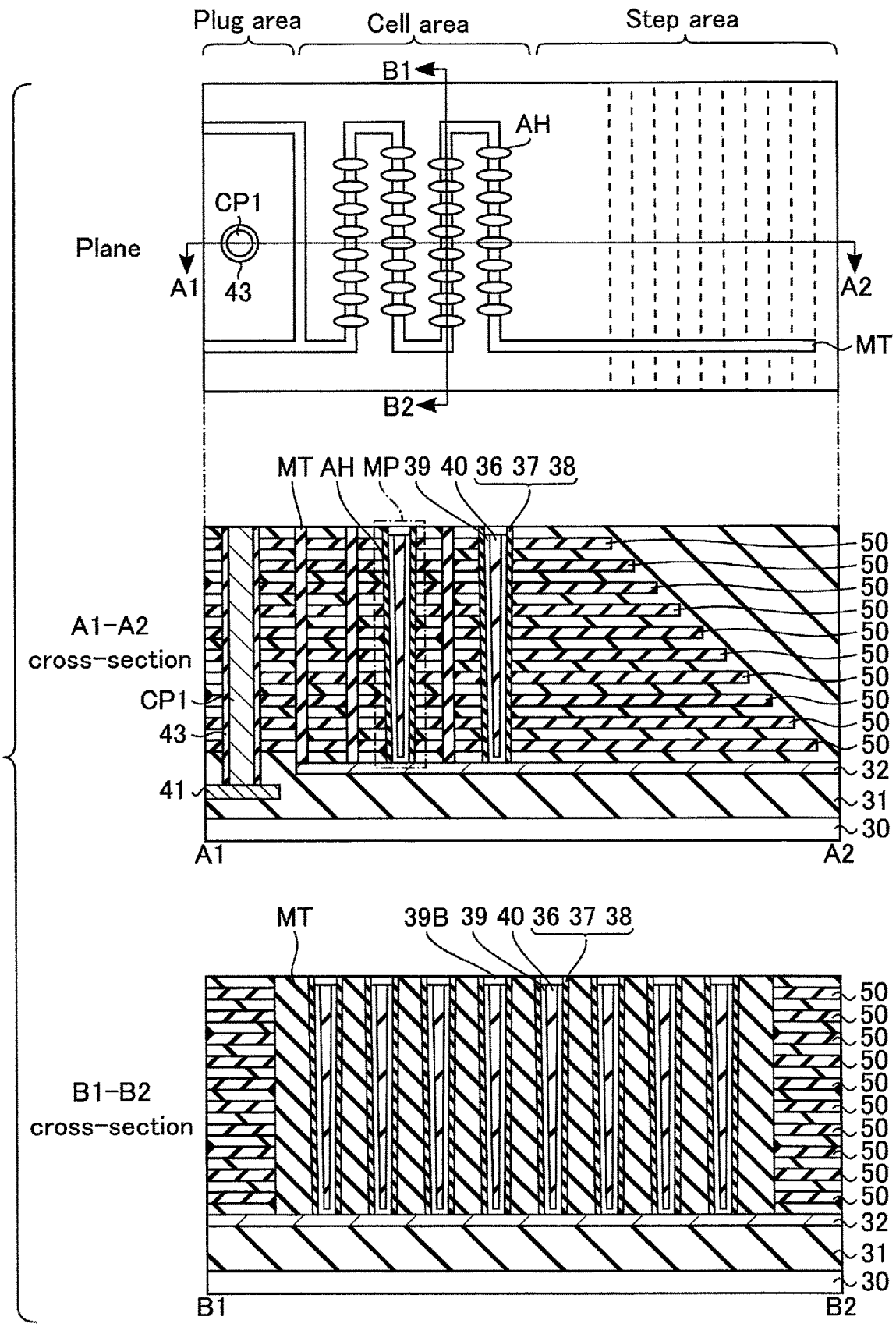

As shown in FIG. 10, contact plug CP1 is formed. More specifically, after forming a hole corresponding to contact plug CP1 by dry etching, a $SiO_2$ film is formed by atomic layer deposition (ALD), and the hole is filled up by stacking TiN and W alternately by chemical vapor deposition (CVD) after $SiO_2$ in the bottom of the hole AH is removed by reactive ion etching (RIE). Next, TiN and W on the insulating layer 31 are removed.

Figure 11:
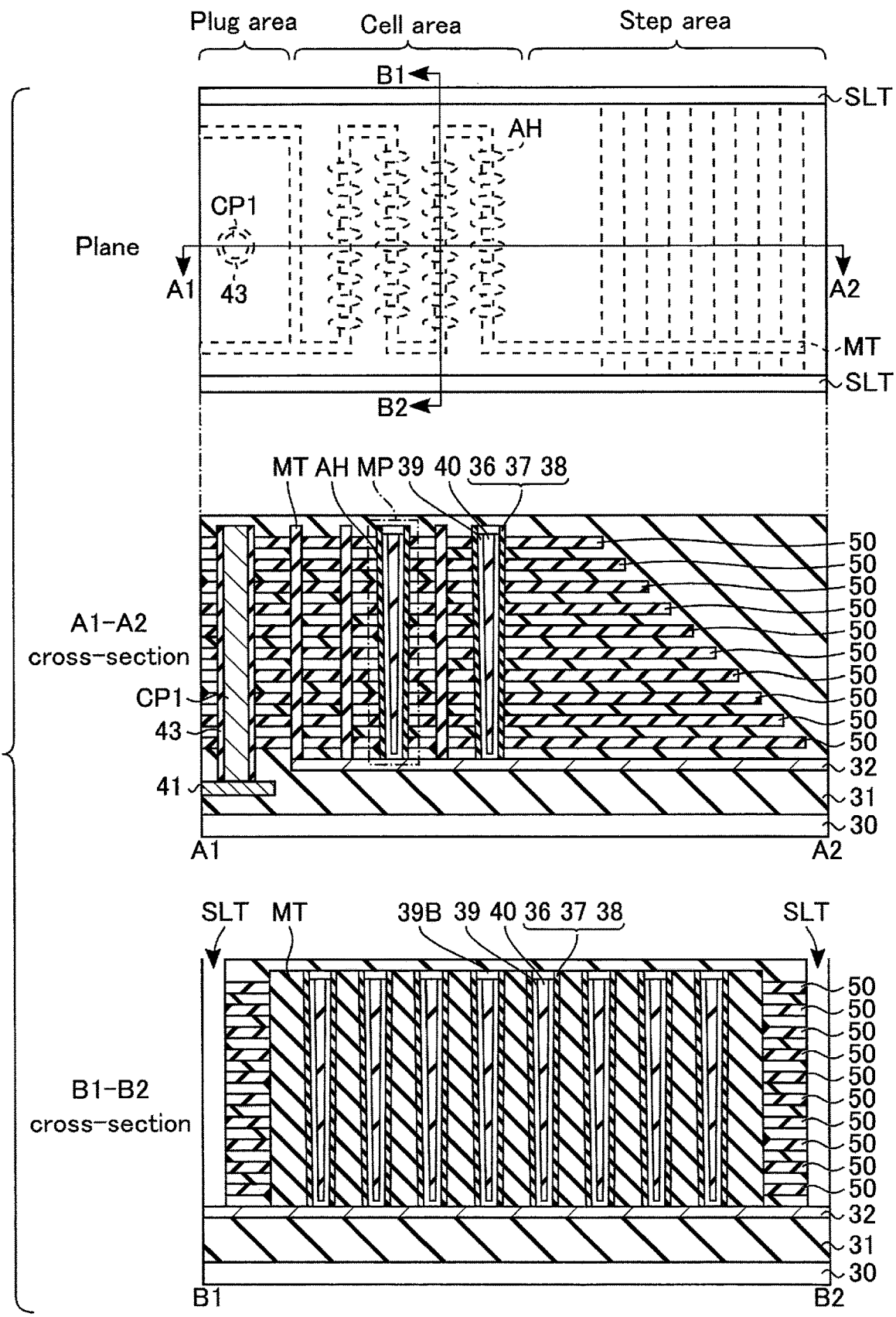

As shown in FIG. 11, after forming the insulating layer 31 and covering the memory pillars MP, the memory trench MT, and the upper surface of contact plug CP1, the slits SLT that reach the interconnect layer 32 with their bottoms are formed. At this time, the sides of each sacrificial layer 50 are exposed to the slits SLT.

Figure 12:
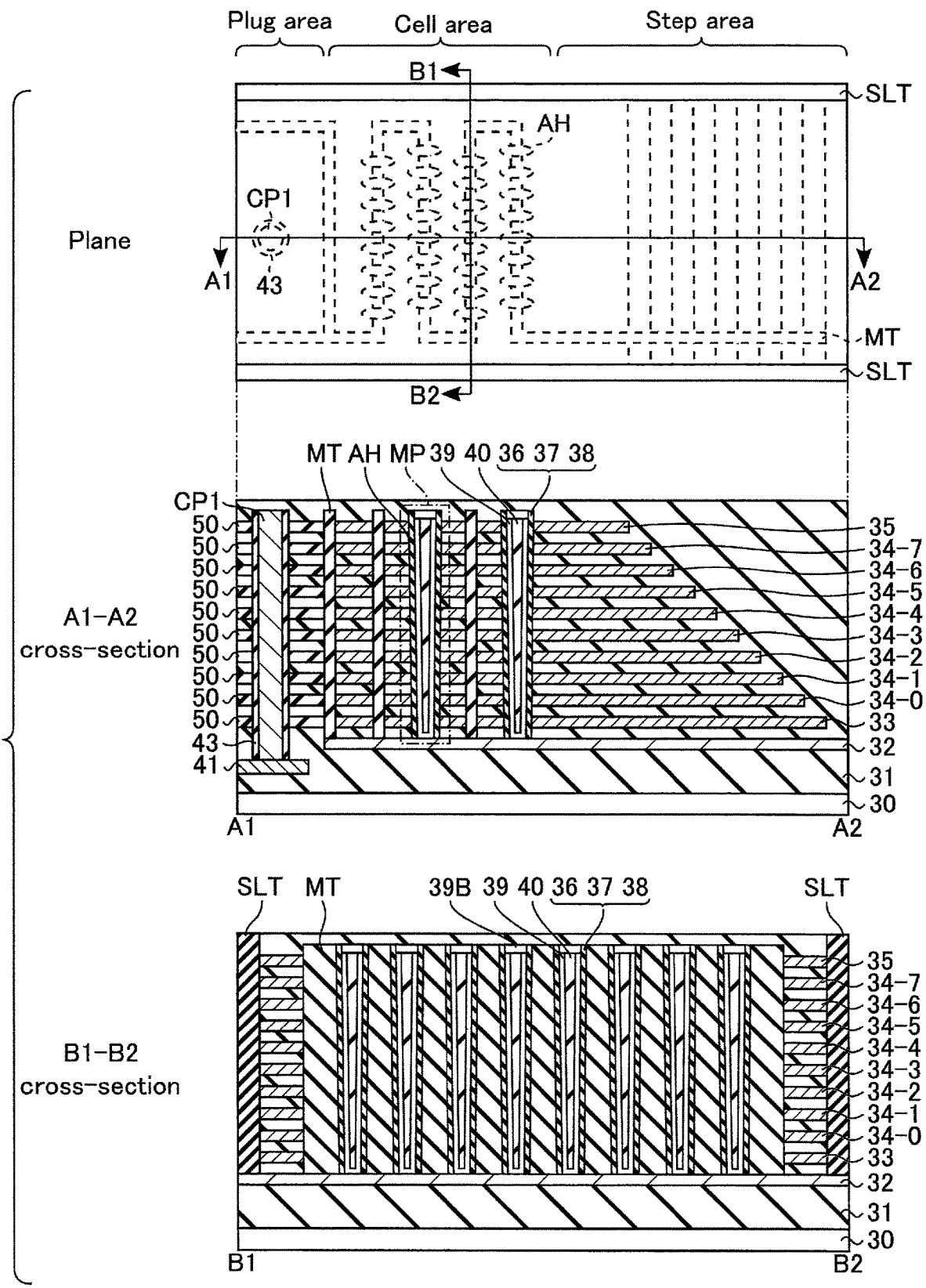

As shown in FIG. 12, after performing the replacement and forming the interconnect layers 33, 34-0 through 34-7, and 35, the slits SLT are filled with $SiO_2$. More specifically, wet etching using, for example, phosphoric acid ($H_3PO_4$) is first performed. The sacrificial layers 50 (SiN) are thereby etched from the slit SLT, and gaps are formed. Next, TiN and W are formed in order to fill in the gaps. Next, TiN and W on the side surface of the slit SLT and on the top surface of the insulating layer 31 are removed, thereby forming the interconnect layers 33, 34-0 through 34-7, and 35. Next, the slit SLT is filled with $SiO_2$.

Figure 13:
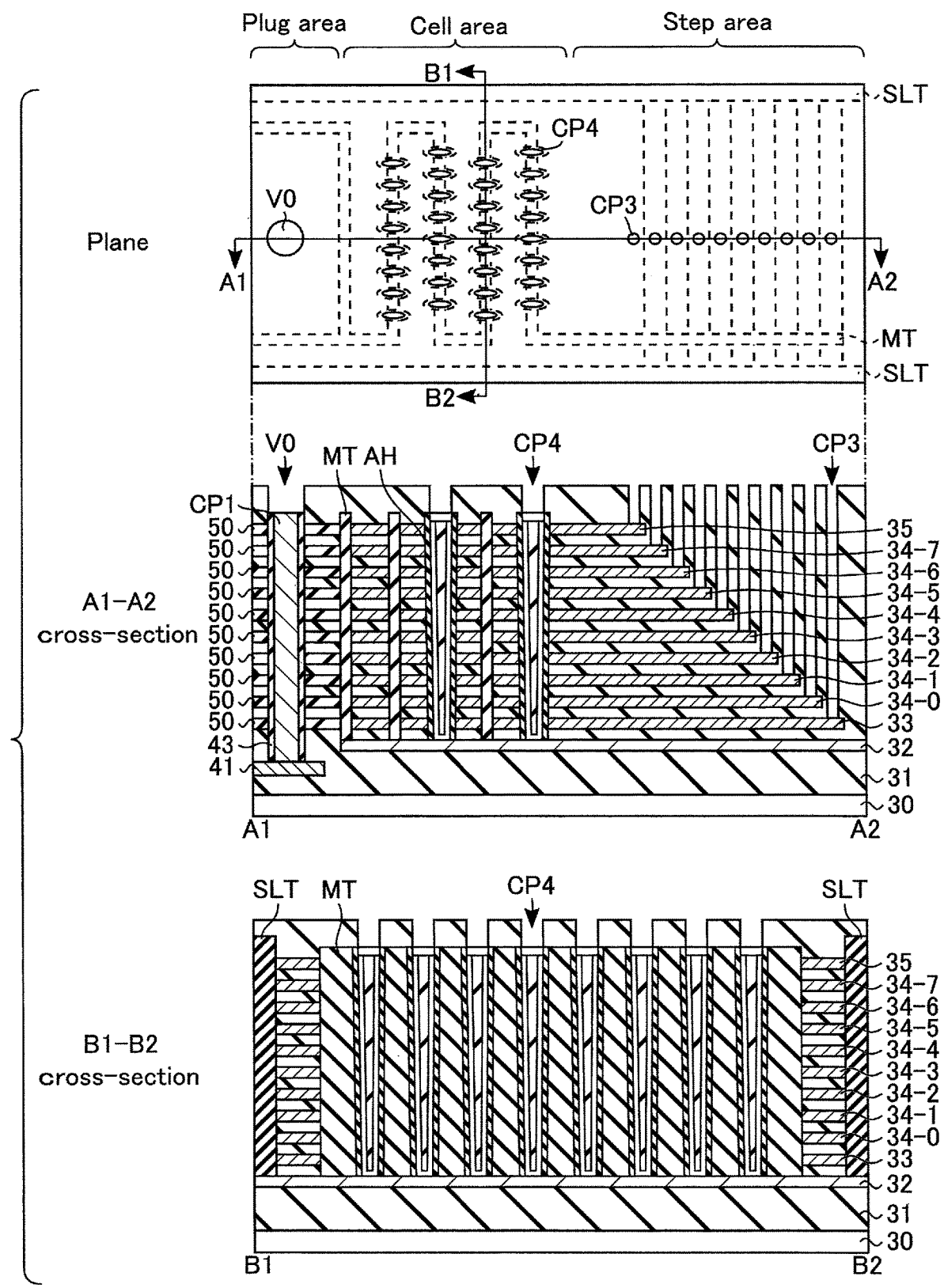

As shown in FIG. 13, holes corresponding to contact plugs V0, CP4, and CP3 are made. The order of making the holes is not limited to the order described herein. The holes may be made in a batch, or may be individually made.

Figure 14:
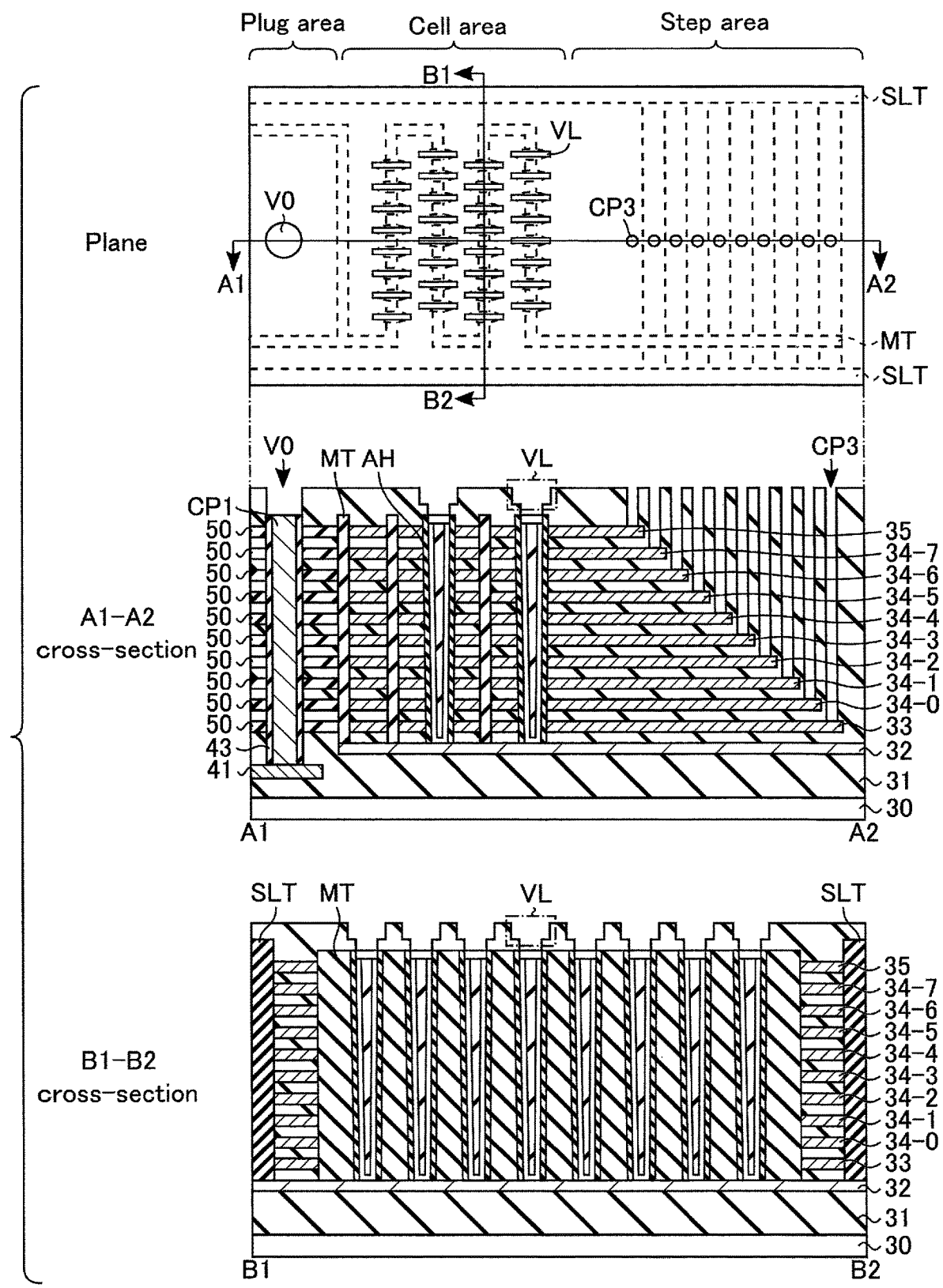

As shown in FIG. 14, a trench pattern corresponding to the interconnect layer VL is formed.

Figure 15:
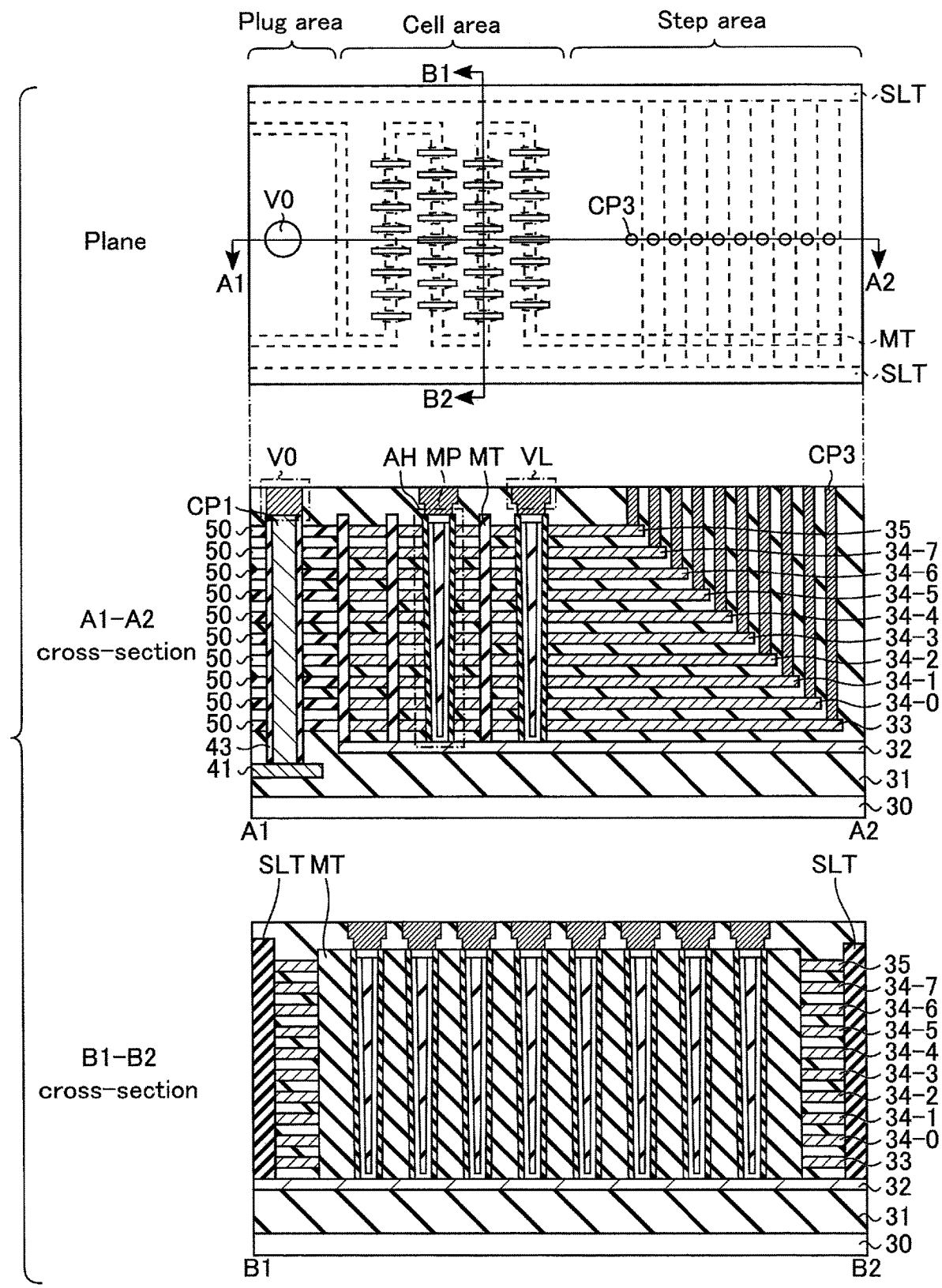

As shown in FIG. 15, after laminating a barrier layer (e.g., Ti and TiN) and W, the barrier layer and W on the insulating layer 31 are removed, and contact plugs V0, CP4, and CP3, and the interconnect layer VL are formed in a batch.

1.3 Advantageous Effects of First Embodiment

The configuration according to the present embodiment can improve the reliability. Such advantageous effects will be explained in detail.

For example, if each of the interconnect layers 33, 34-0 through 34-7, and 35 are divided into a plurality of interconnect layers extending in the X-axis direction, in other words, if a plurality of memory trenches MT extending in the X-axis direction are formed, a width of the memory trench MT and a distance between memory trenches MT in the plug area are smaller than those in the cell area, because it is necessary to reserve an area where contact plug CP1 is to be formed, and to couple the word lines WL and select gate lines SGD and SGS between two cell areas with a plug area being interposed therebetween. For this reason, there is a high possibility that a pattern of the interconnect layer (sacrificial layer 50) collapses in the plug area at the time of forming the memory trench MT. Furthermore, when a plurality of interconnect layers extending in the X-axis layer are formed, a hole-shaped slit SLT is formed on the memory trench MT, and the sacrificial layers 50 are then replaced. For this reason, etching of the sacrificial layers 50 is insufficiently performed, and gaps are not properly filled with TiN and W; as a result, a possibility of failure in forming the interconnect layers increases. Furthermore, an effective interconnect width of each interconnect layer becomes narrower because of the plurality of memory pillars MP arranged along the memory trench MT; as a result, a wiring resistance of the word lines WL and select gate lines SGD and SGS tends to be higher.

In contrast, in the configuration according to the present embodiment, each of the interconnect layers 33, 34-0 through 34-7, and 35 includes the electrode HW extending in the X-axis direction and a plurality of electrodes FNG extending in the Y-axis direction. Furthermore, the electrodes FNG of two interconnect layers in the same layer can be alternately arranged in the X-axis direction in the cell area, and the plurality of memory pillars MP can be arranged between the two electrodes FNG along the Y-axis direction. Thus, the interconnect layers 33, 34-0 through 34-7, and 35 are not divided by the memory trench MT in the plug area; as a result, it is possible to prevent the interconnect width and the distance between the interconnects from becoming smaller, and to reduce the possibility of a pattern collapse.

Furthermore, according to the configuration of the embodiment, the slits SLT are formed on the sides of the sacrificial layers 50 corresponding to the electrode HW and thereby the replacement can be performed; thus, it is possible to supply a solution ($H_3PO_4$) for wet etching from a line-shaped area which is of a size generally larger than a hole, and to suppress failures in forming interconnect layers due to insufficient removal of the sacrificial layers 50 and insufficient filling of gaps.

Furthermore, according to the configuration of the present embodiment, no memory pillars MP are formed above the electrode HW, and thereby a width of the electrode HW is ensured; therefore, it is possible to suppress an increase in wiring resistance.

Furthermore, since an increase in wiring resistance in the interconnect layers 33, 34-0 through 34-7 and 35 can be suppressed, it is possible to suppress an increase in a pressurizing period when a voltage is applied to the interconnect layers 33, 34-0 through 34-7 and 35. Accordingly, it is possible to suppress a decrease in a processing rate of the semiconductor memory device.

2. Second Embodiment

Next, the second embodiment will be described. In the second embodiment, an example of forming a memory trench MT corresponding to two string units SU will be explained. Hereinafter, only matters different from the first embodiment will be described.

2.1 Circuit Configuration of Memory Cell Array

Figure 16:
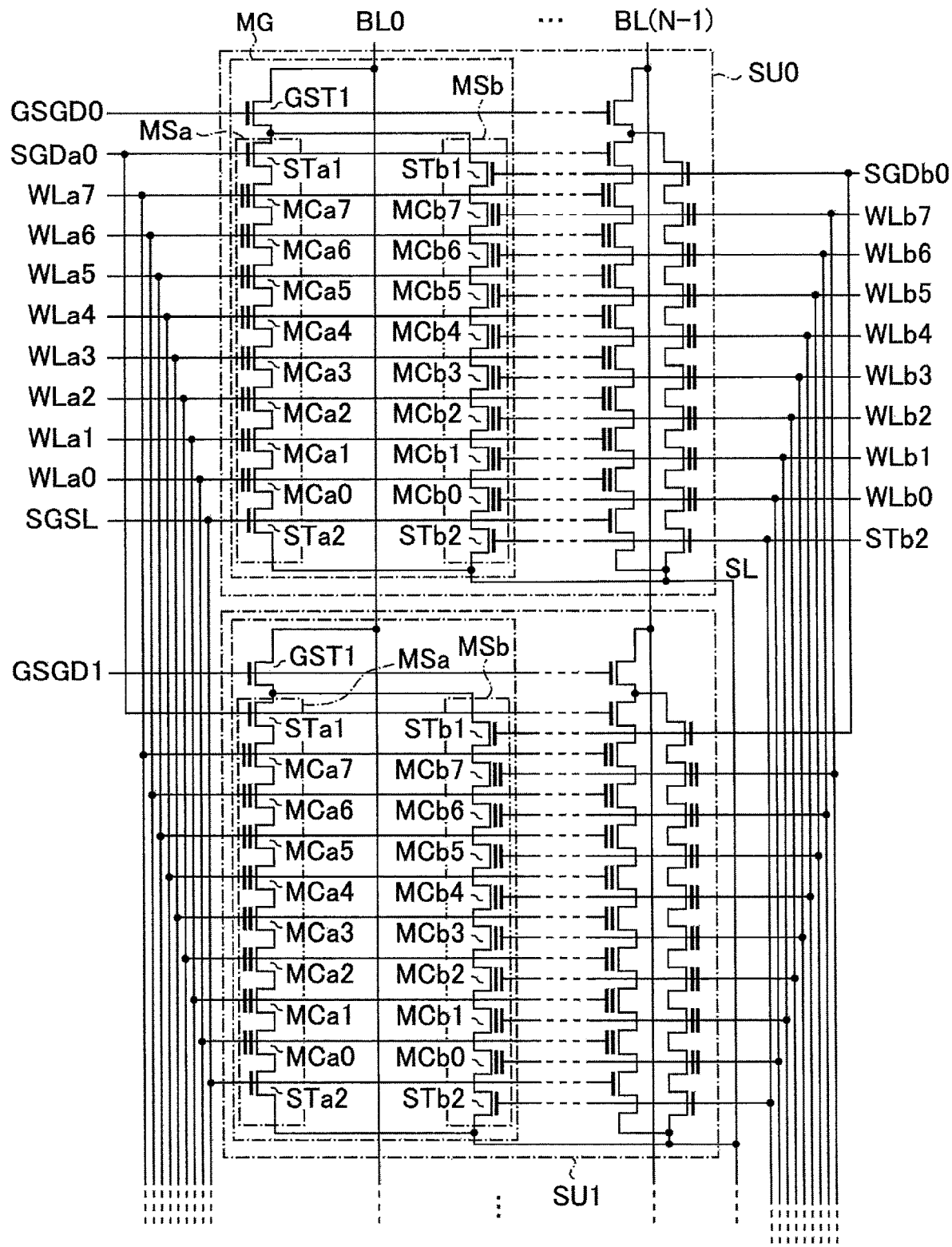
FIG. 16 is a circuit diagram of a memory cell array included in a semiconductor memory device according to a second embodiment.

First, the circuit configuration of the memory cell array 11 will be described with reference to FIG. 16. FIG. 16 is a circuit diagram of the memory cell array 11 in one block BLK.

As shown in FIG. 16, a memory group MG includes two memory strings, MSa and MSb, and global select transistor GST1. More specifically, the configuration of memory strings MSa and MSb is the same as that of the first embodiment shown in FIG. 2. The drains of select transistors STa1 and STb1 are coupled to the source of global select transistor GST1 in common. The drain of global select transistor GST1 is coupled to any of the bit lines BL.

The gates of a plurality of global select transistors GST1 in a string unit SU are coupled to global select gate line GSGD in common. More specifically, the gates of the plurality of global select transistors GST1 in string unit SU0 are coupled to global select gate line GSGD0 in common. Similarly, the gates of the plurality of global select transistors GST1 in string unit SU1 are coupled to global select gate line GSGD1 in common. Each global select gate line GSGD is independently controlled by the row decoder 12.

The gates of a plurality of select transistors STa1 in string units SU0 and SU1 are coupled to select gate line SGDa0. Similarly, the gates of the plurality of select transistors STb1 in string units SU0 and SU1 are coupled to select gate line SGDb0.

Accordingly, when the memory string MSa in string unit SU0 is selected, a high-level voltage is applied to global select gate line GSGD0 and select gate line SGDa0. As a result, global select transistors GST1 and select transistors STa1 of string unit SU0 are turned into an on state. When memory string MSb of string unit SU0 is selected, a high-level voltage is applied to global select gate line GSGD0 and select gate line SGDb0. As a result, global select transistors GST1 and select transistors STb1 of string unit SU0 are turned into an on state. Similarly, when memory string MSa of string unit SU1 is selected, a high-level voltage is applied to global select gate line GSGD1 and select gate line SGDa0, and if memory string MSb of string unit SU1 is selected, a high-level voltage is applied to global select gate line GSGD1 and select gate line SGDb0.

2.2 Planar Configuration of Memory Cell Array

Figure 17:
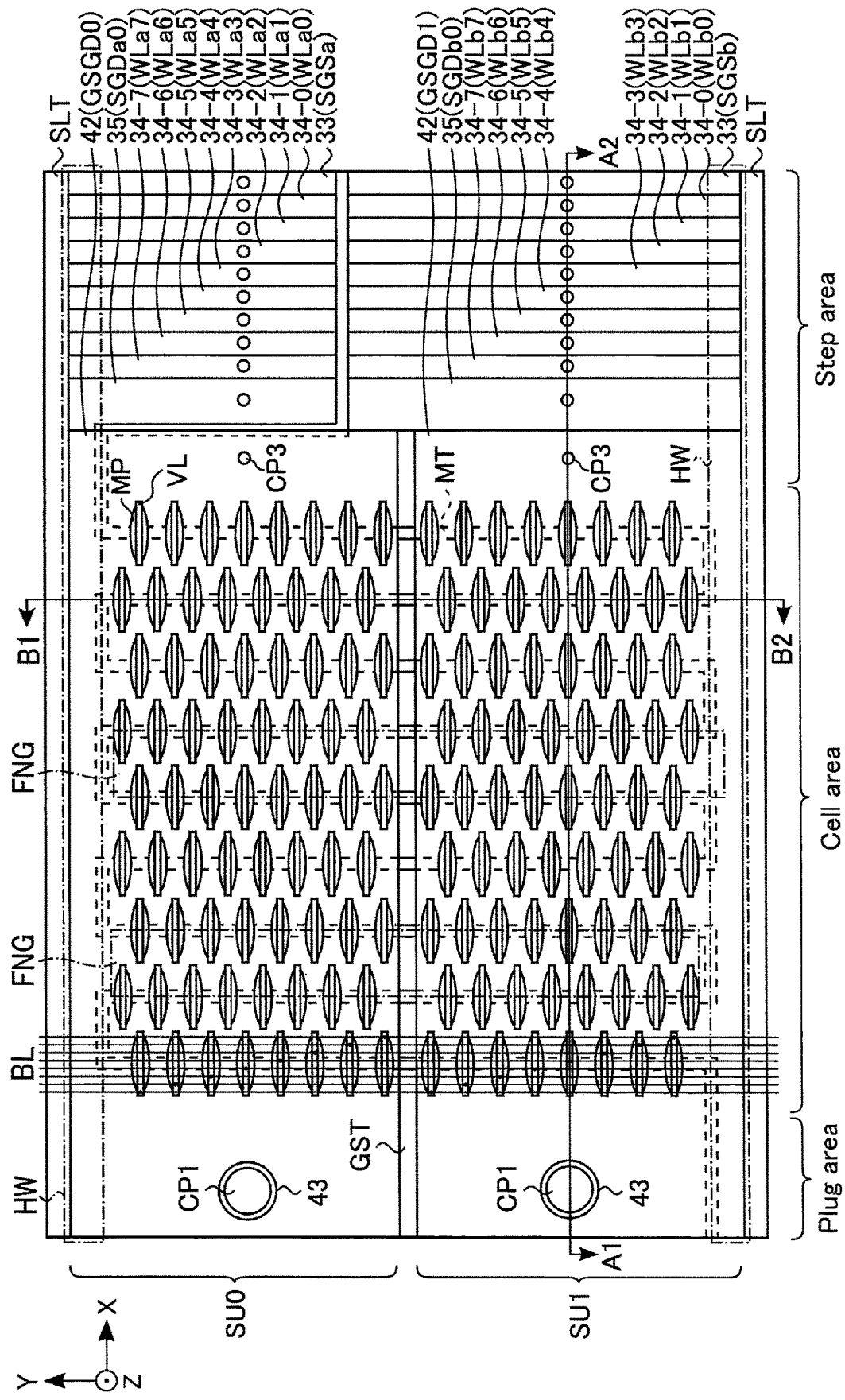
FIG. 17 is a plan view of the memory cell array included in the semiconductor memory device according to the second embodiment.

Next, the planar configuration of the memory cell array 11 will be described with reference to FIG. 17. FIG. 17 is a plan view partially showing string units SU0 and SU1. In the example shown in FIG. 17, some of the bit lines BL and the intra-layer insulating films are omitted.

As shown in FIG. 17, in the present embodiment, string units SU0 and SU1 share the word lines WL and select gate lines SGD and SGS, and one memory trench MT is provided for string units SU0 and SU1. The memory trench MT divides the interconnect layer 33 that functions as select gate line SGS, the interconnect layers 34-0 through 34-7 that function as word lines WL0 through WL7, and the interconnect layer 35 that functions as select gate line SGD, into two parts. Each of the interconnect layers 33, 34-0 through 34-7, and 35 includes electrode HW and a plurality of electrodes FNG, similarly to the first embodiment. Furthermore, the memory trench MT has a shape of a square wave so as to divide the plurality of electrodes FNG.

An interconnect layer 42 that functions as global select gate line GSGD is formed above the interconnect layer 35. The interconnect layer 42 is divided into two by the slit GST and the slit SLT extending in the X-axis direction, and the divided layer functions as global select gate lines GSGD0 and GSGD1.

In the cell area, the memory pillars MP that pass through the interconnect layers 33, 34-0 through 34-7, 35, and 42 are formed between electrodes FNG extending in the Y-axis direction. More specifically, eight memory pillars MP corresponding to string unit SU0 and eight memory pillars MP corresponding to string unit SU1 are arranged in the Y-axis direction, and groups of the eight memory pillars are arranged in a staggered manner along the X-axis direction.

In the present embodiment, the interconnect layers 33, 34-0 through 34-7, 35, and 42 are formed throughout the plug area. The outer side surface of contact plug CP1 is covered with an insulating layer 43, so that the interconnect layers 33, 34-0 through 34-7, 35, and 42 are not in contact with contact plug CP1.

In the step area, terraces respectively corresponding to global select gate lines GSGD, the word lines WL, and select gate lines SGD and SGS are arranged.

In string units SU0 and SU1, the slits SLT are provided in the sides that extend in the X-axis direction and that do not contact the slit GST.

2.3 Cross-Sectional Configuration of Memory Cell Array

Figure 18:
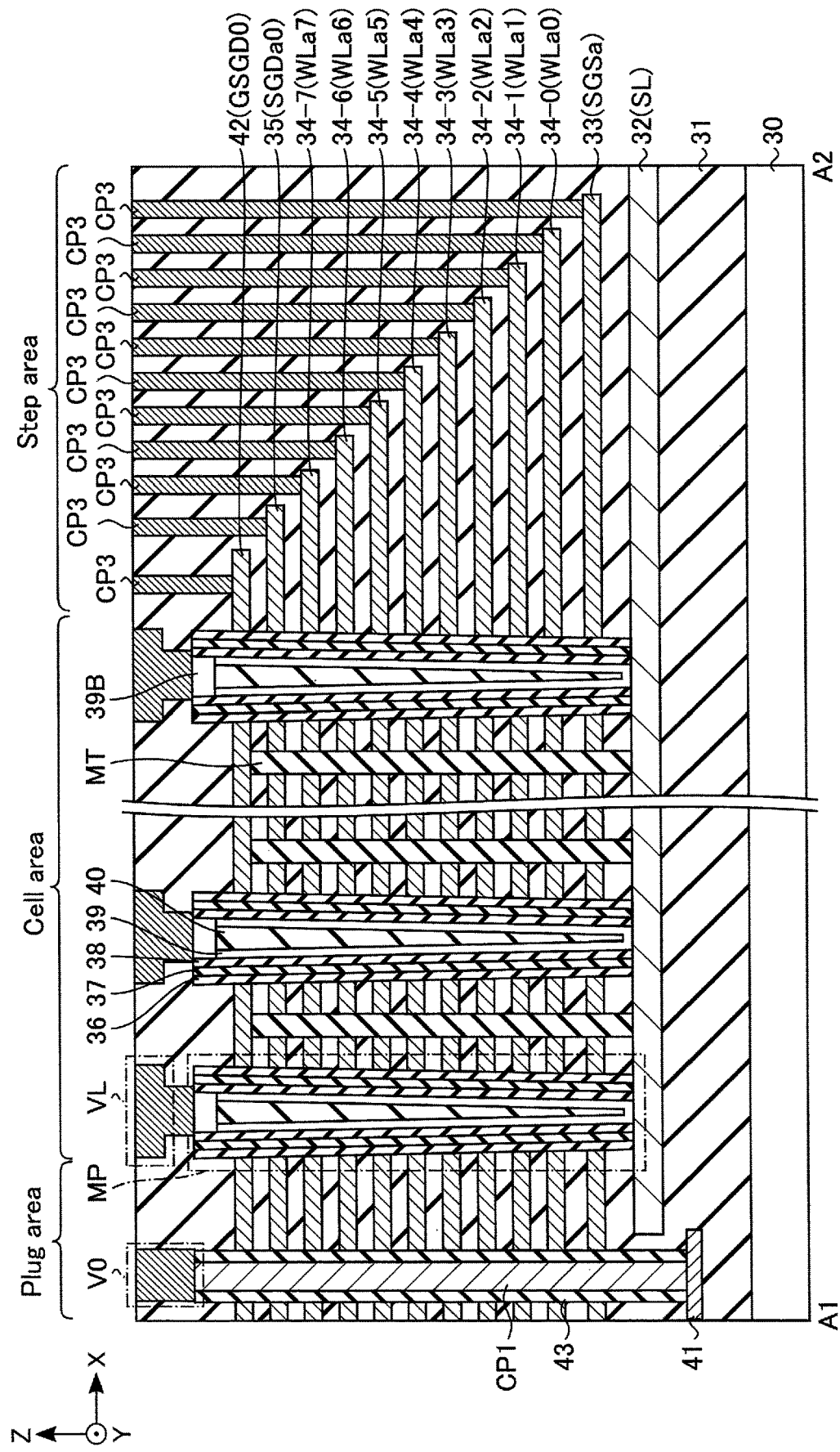
FIG. 18 is a sectional view of the memory cell array, taken along line A1-A2 shown in FIG. 17.
Figure 19:
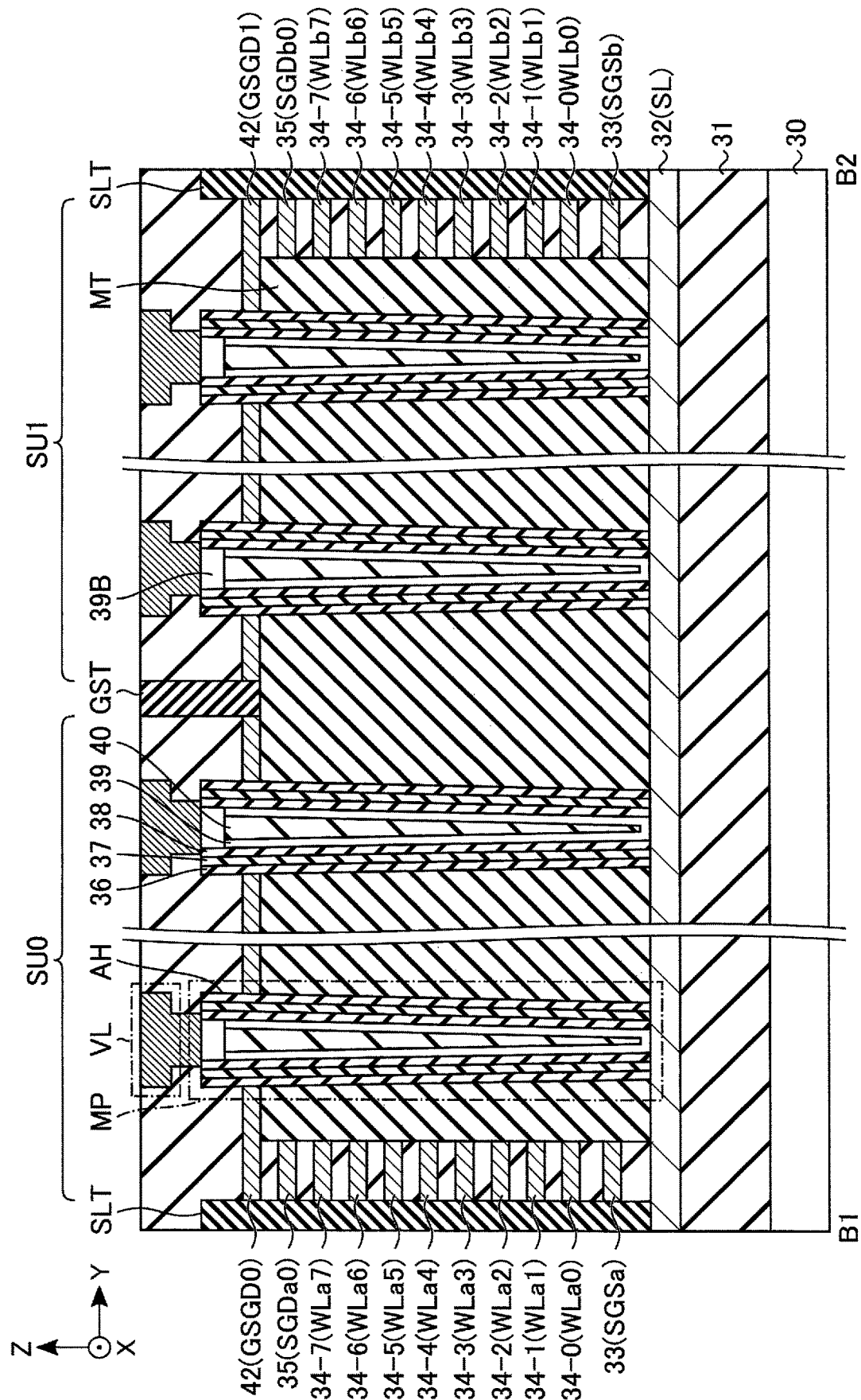
FIG. 19 is a sectional view of the memory cell array, taken along line B1-B2 shown in FIG. 17.

Next, a cross-sectional configuration of the memory cell array 11 will be described with reference to FIGS. 18 and 19. FIG. 18 is a sectional view of the memory cell array 11, taken along line A1-A2 shown in FIG. 17. FIG. 19 is a sectional view of the memory cell array 11, taken along line B1-B2 shown in FIG. 17. To simplify the description, contact plugs CP2 and the bit lines BL are omitted in the examples shown in FIGS. 18 and 19.

As shown in FIG. 18, an interconnect layer 42 is formed on the memory trench MT. The interconnect layer 42 is made of a conductive material, and as the conductive material, a metallic material, such as W or TiN, or a semiconductor, such as Si, may be used. Hereinafter, an example where W and TiN are used for the interconnect layer 42, similar to the interconnect layers 33, 34-0 through 34-7, and 35, will be explained. The interconnect layer 42 is formed as a result of, for example, a replacement process, similar to the interconnect layers 33, 34-0 through 34-7, and 35.

In the cell area, the memory pillars MP that pass through the interconnect layers 33, 34-0 through 34-7, 35, and 42, and that are in contact with the interconnect layer 32 at their bottom surfaces, are formed.

In the plug area, contact plug CP1 that passes through the interconnect layers 33, 34-0 through 34-7, 35, and 42 and reaches the interconnect layer 41 with its bottom surface is formed, and the outer side surface of contact plug CP1 is covered with the insulating layer 43. For the insulating layer 43, $SiO_2$ is used, for example. Similar to the first embodiment, the interconnect layer 41 is an interconnect layer of an external circuit including the transistors formed above the semiconductor substrate 30.

In the step area, the terraces are formed by drawing out the interconnect layers 33, 34-0 through 34-7, 35, and 42 in a stepwise manner in the X-axis direction. On each terrace, contact plug CP3 is formed.

As shown in FIG. 19, the interconnect layer 42 is divided by the slit GST. In the example shown in FIG. 19, the interconnect layer 42 arranged on the left side of the slit GST as shown in the drawing functions as global select gate line GSGD0. On the other hand, the interconnect layer 42 arranged on the right side of the slit GST as shown in the drawing functions as global select gate line GSGD1.

The slits SLT extending in the X-axis direction are formed in the left side of string unit SU0 shown in the drawing, and in the right side of string unit SU1 shown in the drawing. The side surfaces of the slits SLT are in contact with the interconnect layers 33, 34-0 through 34-7, 35, and 42.

2.4 Method of Forming Memory Cell Array

Next, a method of forming the memory cell array 11 will be explained with reference to FIGS. 20-25. Each of FIGS. 20 to 25 shows the plane of string units SU0 and SU1, the A1-A2 cross section, and the B1-B2 cross section explained with reference to FIGS. 17 to 19.

Hereinafter, an example where the interconnect layers 33, 34-0 through 34-7, 35, and 42 are formed by the replacement process will be explained in the present embodiment.

Figure 20:
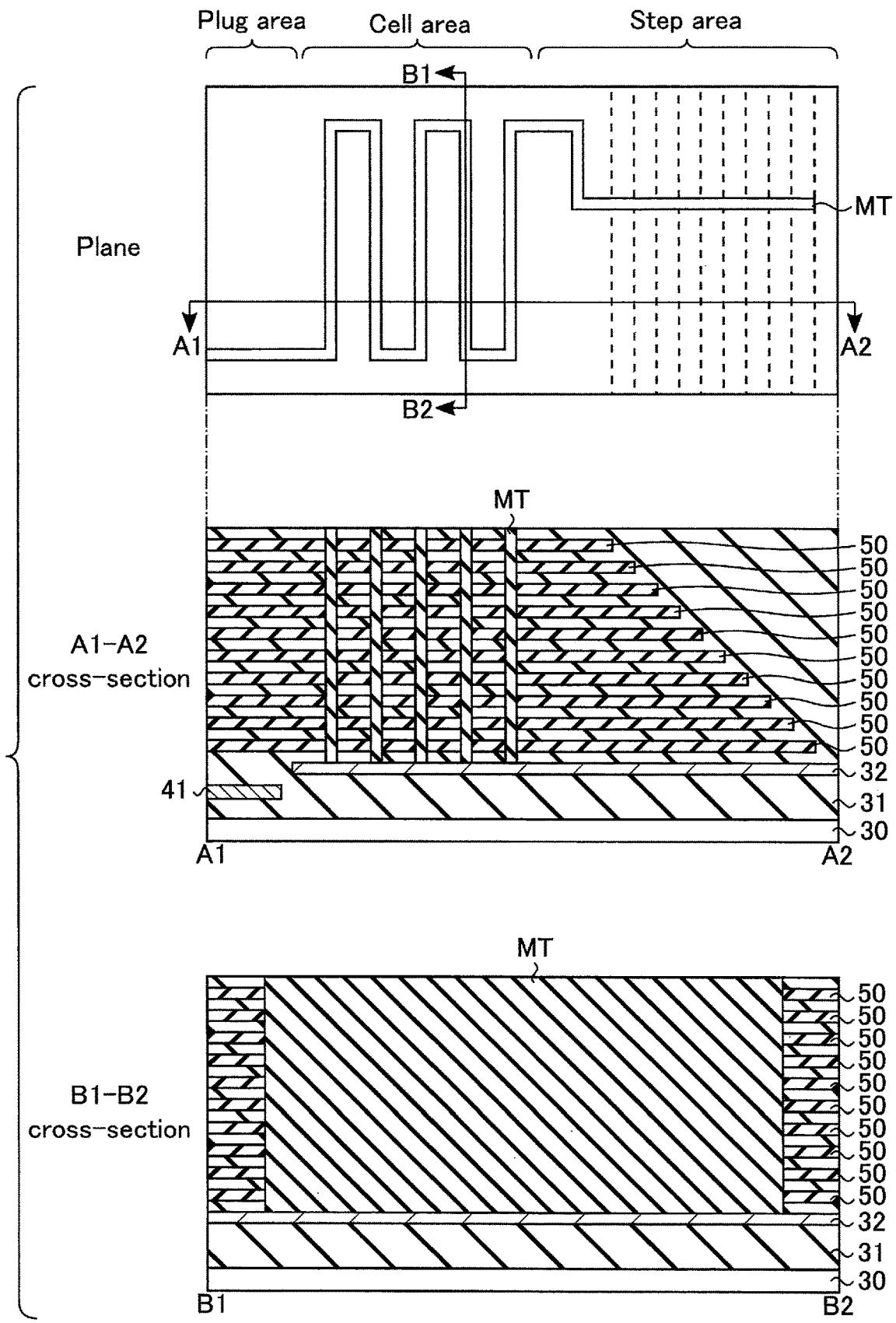
FIGS. 20-25 are diagrams showing a process of manufacturing the semiconductor memory device according to the second embodiment.

As shown in FIG. 20, similarly to FIGS. 7 and 8 showing the first embodiment, a memory trench MT is formed after forming ten sacrificial layers 50 respectively corresponding to the interconnect layers 33, 34-0 through 34-7, and 35.

Figure 21:
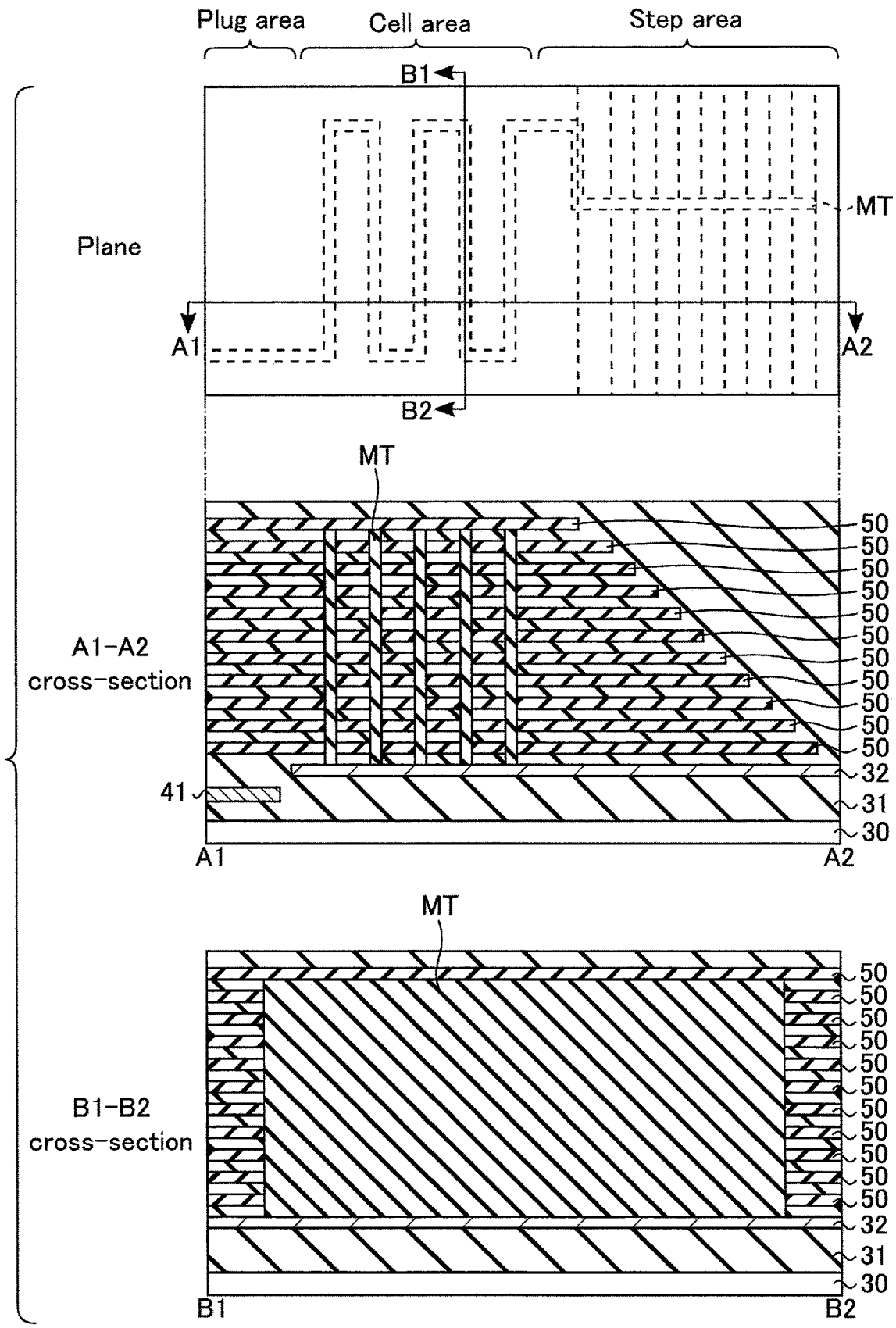

As shown in FIG. 21, an insulating layer 31 is formed after the sacrificial layer 50 corresponding to the interconnect layer 42 is formed. At this time, the 11 layers of the sacrificial layers 50 are drawn out in a stepwise manner in the step area.

Figure 22:
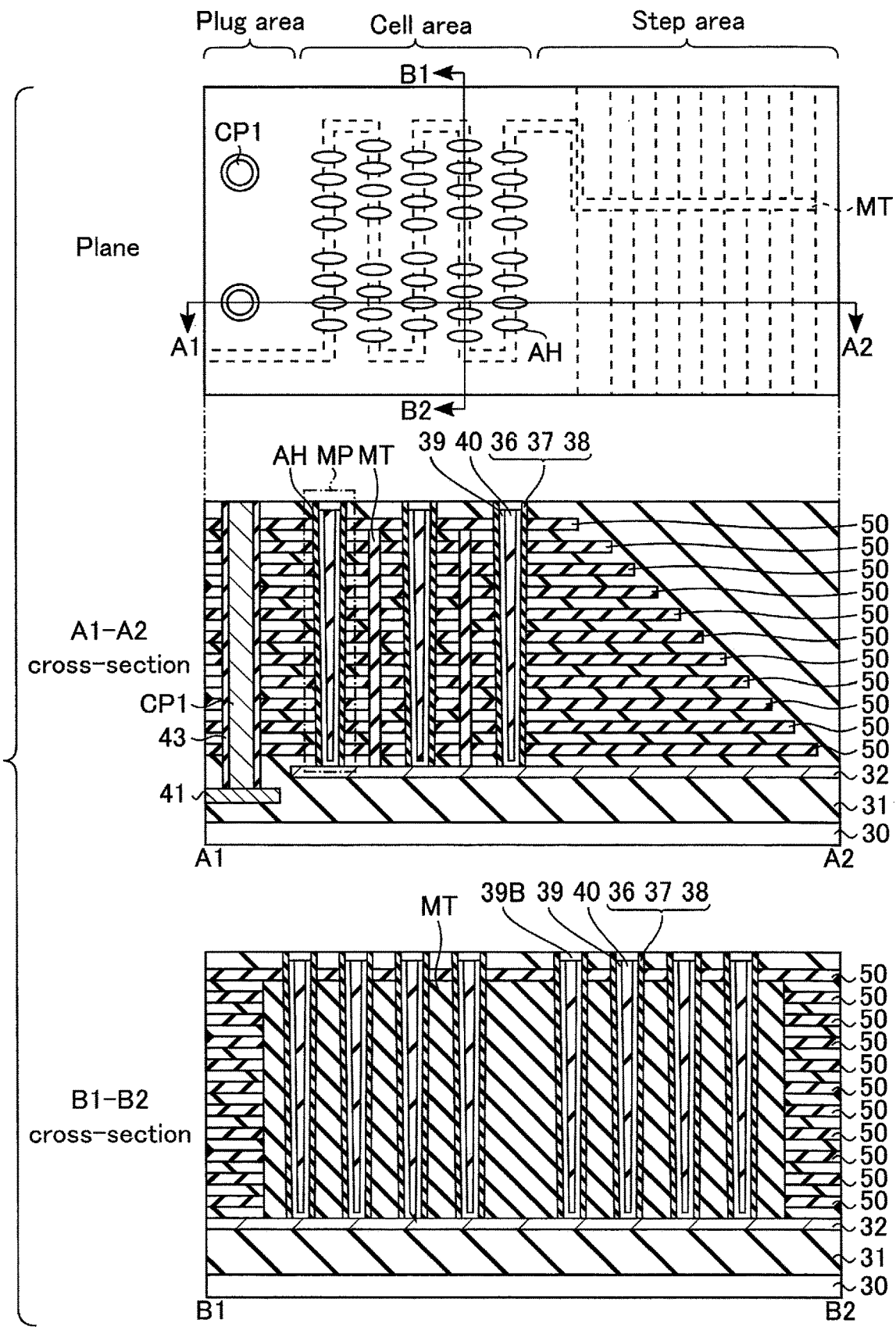

As shown in FIG. 22, the memory pillars MP and contact plug CP1 are formed. More specifically, the memory pillars MP are first formed as explained in the first embodiment with reference to FIG. 9. Next, a hole corresponding to contact plug CP1 is made, and an insulating layer 43 is formed on the inner side surface of the hole. Then, the inside of the hole is filled with TiN and W, thereby forming contact plug CP1.

Figure 23:
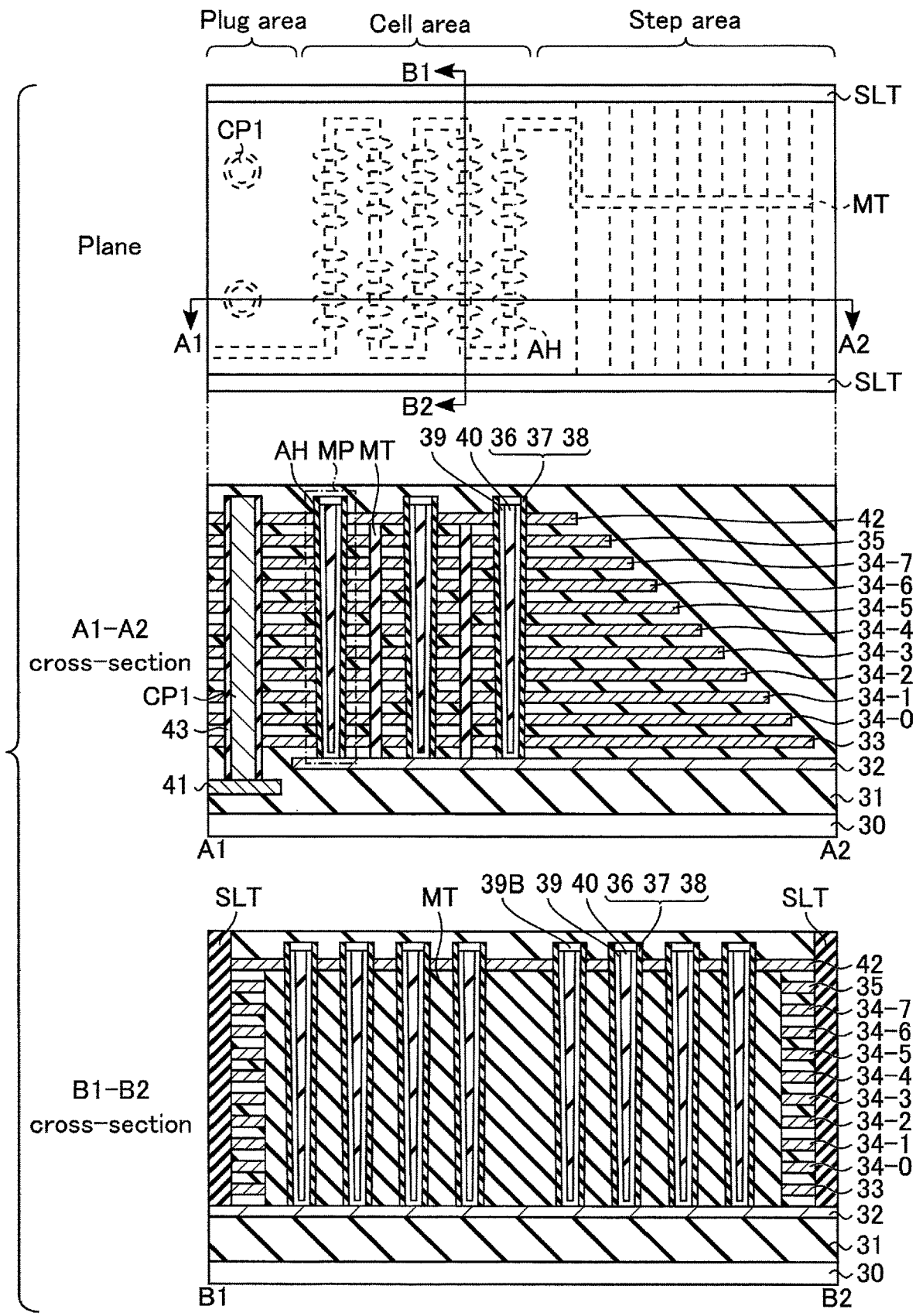

As shown in FIG. 23, after forming the insulating layer 31 and covering the upper surface of the memory pillars MP and contact plugs CP1, the slits SLT reaching the interconnect layer 32 with their bottoms are formed. Next, the replacement process is performed to form the interconnect layers 33, 34-0 through 34-7, 35, and 42. Next, the slits SLT are filled with $SiO_2$, for example.

Figure 24:
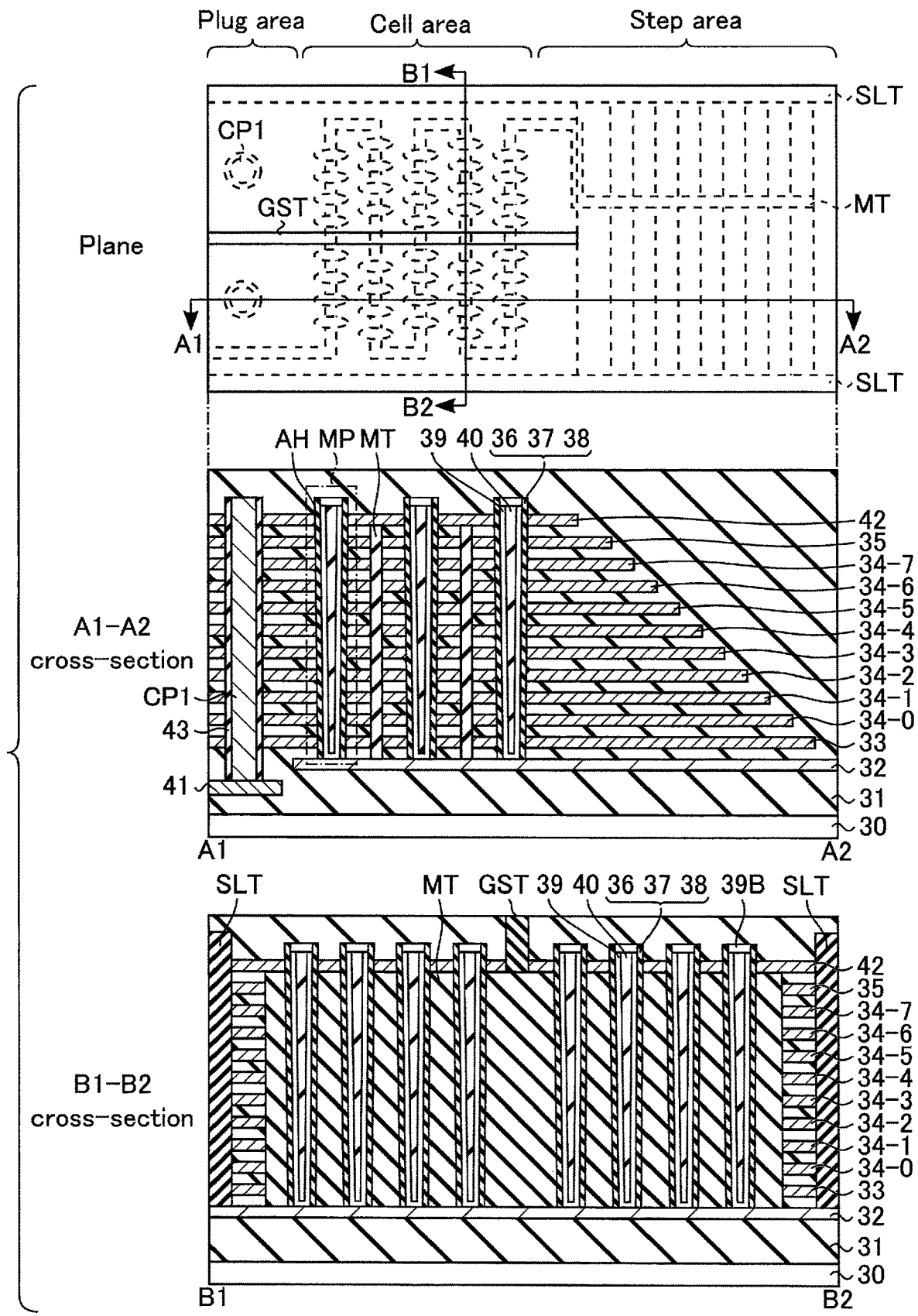

As shown in FIG. 24, after a slit GST is formed to divide the interconnect layer 42, the inside of the slit GST is filled with $SiO_2$, for example.

Figure 25:
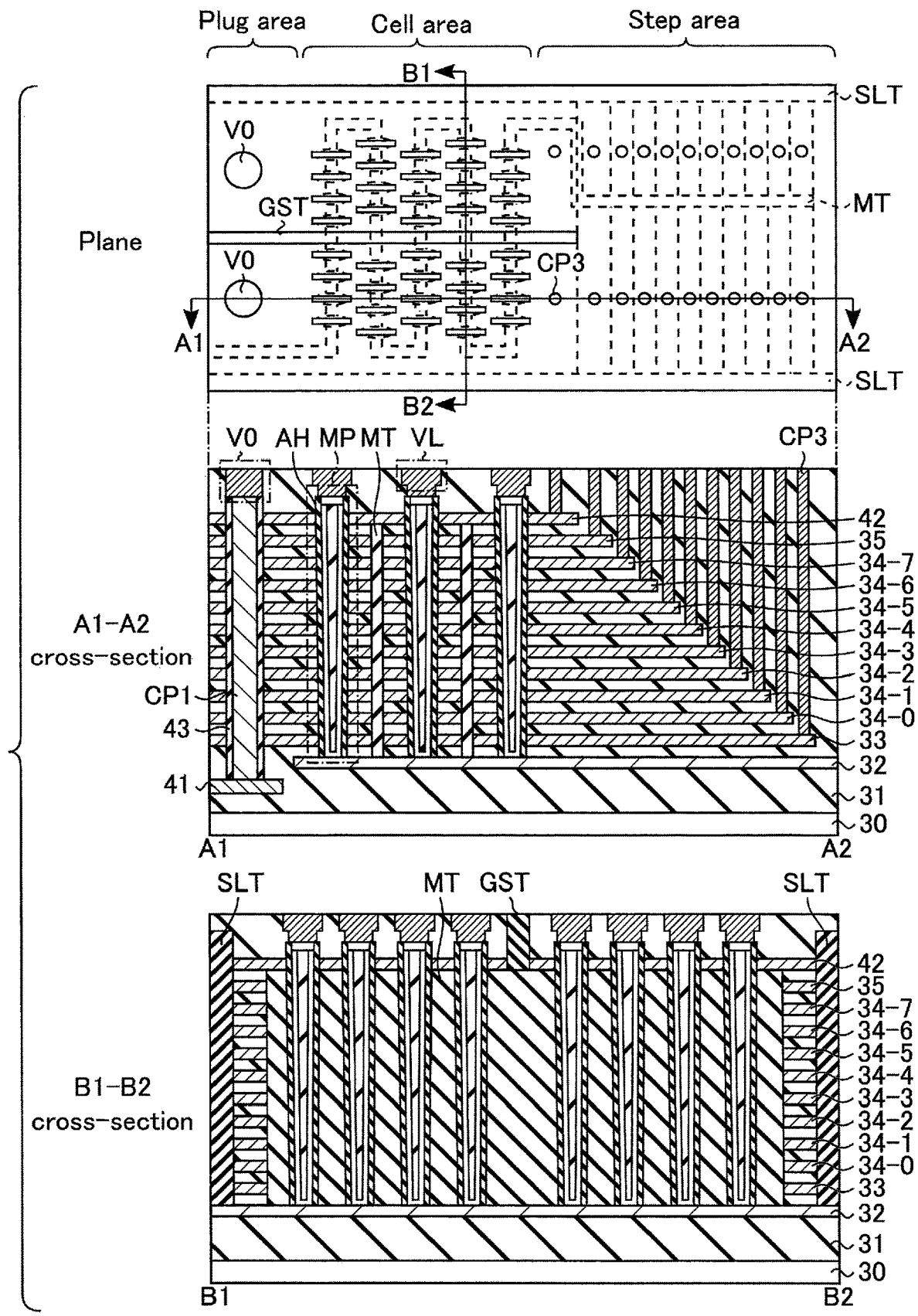

As shown in FIG. 25, contact plugs V0, CP4, and CP3, and the interconnect layer VL are formed in a batch, as explained in the first embodiment with reference to FIGS. 13 to 15.

2.5 Advantageous Effects of Second Embodiment

The configuration of the present embodiment achieves advantageous effects similar to those achieved by the first embodiment.

Furthermore, according to the present embodiment, since two slits SLT are formed for a plurality of string units SU, it is possible to suppress an increase in an area of the slits SLT in the memory cell array 11. It is thereby possible to inhibit an increase in an area of the chip.

In the present embodiment, two string units SU share a select gate line SGD; however, three or more string units SU may share a select gate line SGD.

3. Third Embodiment

Next, the third embodiment will be described. In the third embodiment, an example where materials of electrodes HW and electrodes FNG are different from those described in the first embodiment will be described. Hereinafter, only the matters different from the first embodiment will be described.

3.1 Planar Configuration of Memory Cell Array

Figure 26:
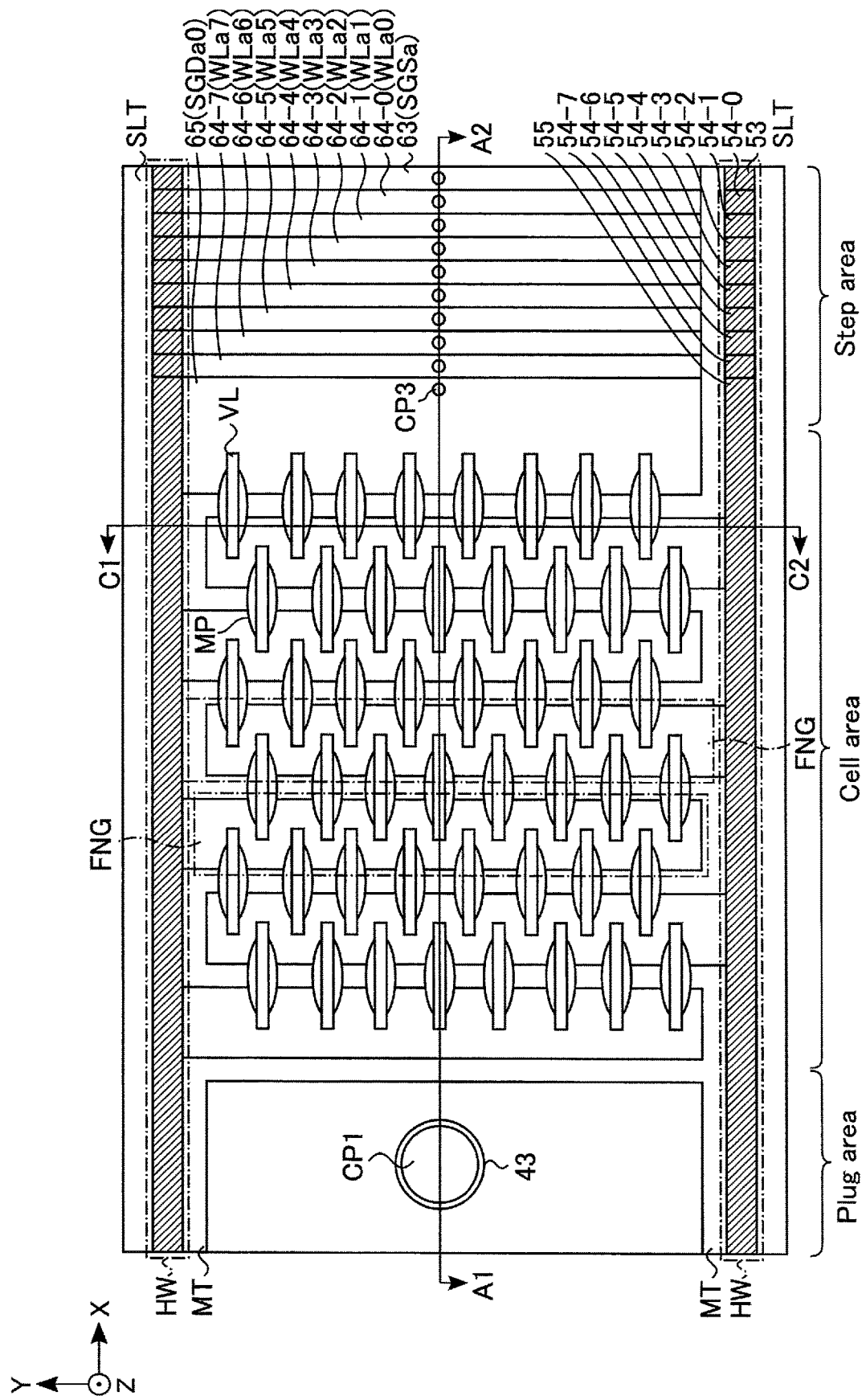
FIG. 26 is a plan view of a memory cell array included in a semiconductor memory device according to a third embodiment.

First, the planar configuration of the memory cell array 11 will be described with reference to FIG. 26. FIG. 26 is a plan view showing a part of string unit SU0. In the example shown in FIG. 26, the bit lines BL and the intra-layer insulating films are omitted.

As shown in FIG. 26, in the present embodiment, the conductive materials of electrodes HW and electrodes FNG are different from those described in the first embodiment. Interconnect layers 53, 54-0 through 54-7 and 55 correspond to electrodes HW of the interconnect layers 33, 34-0 through 34-7 and 35 described in the first embodiment, and the interconnect layers 63, 64-0 through 64-7, and 65 correspond to electrodes FNG and the terraces of the interconnect layers 33, 34-0 through 34-7, and 35 described in the first embodiment.

3.2 Cross-Sectional Configuration of Memory Cell Array

Figure 27:
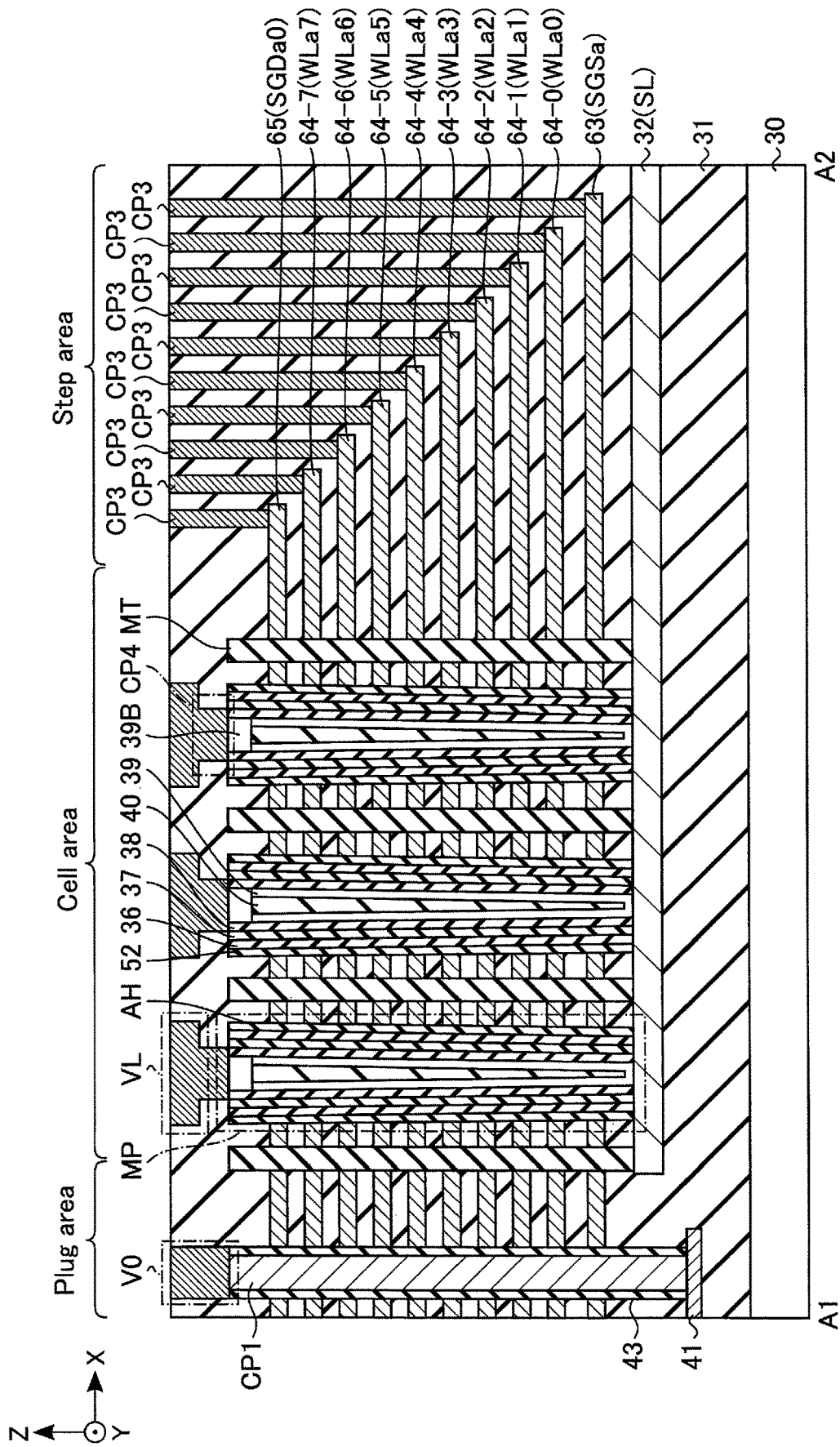
FIG. 27 is a sectional view of the memory cell array, taken along line A1-A2 shown in FIG. 26.
Figure 28:
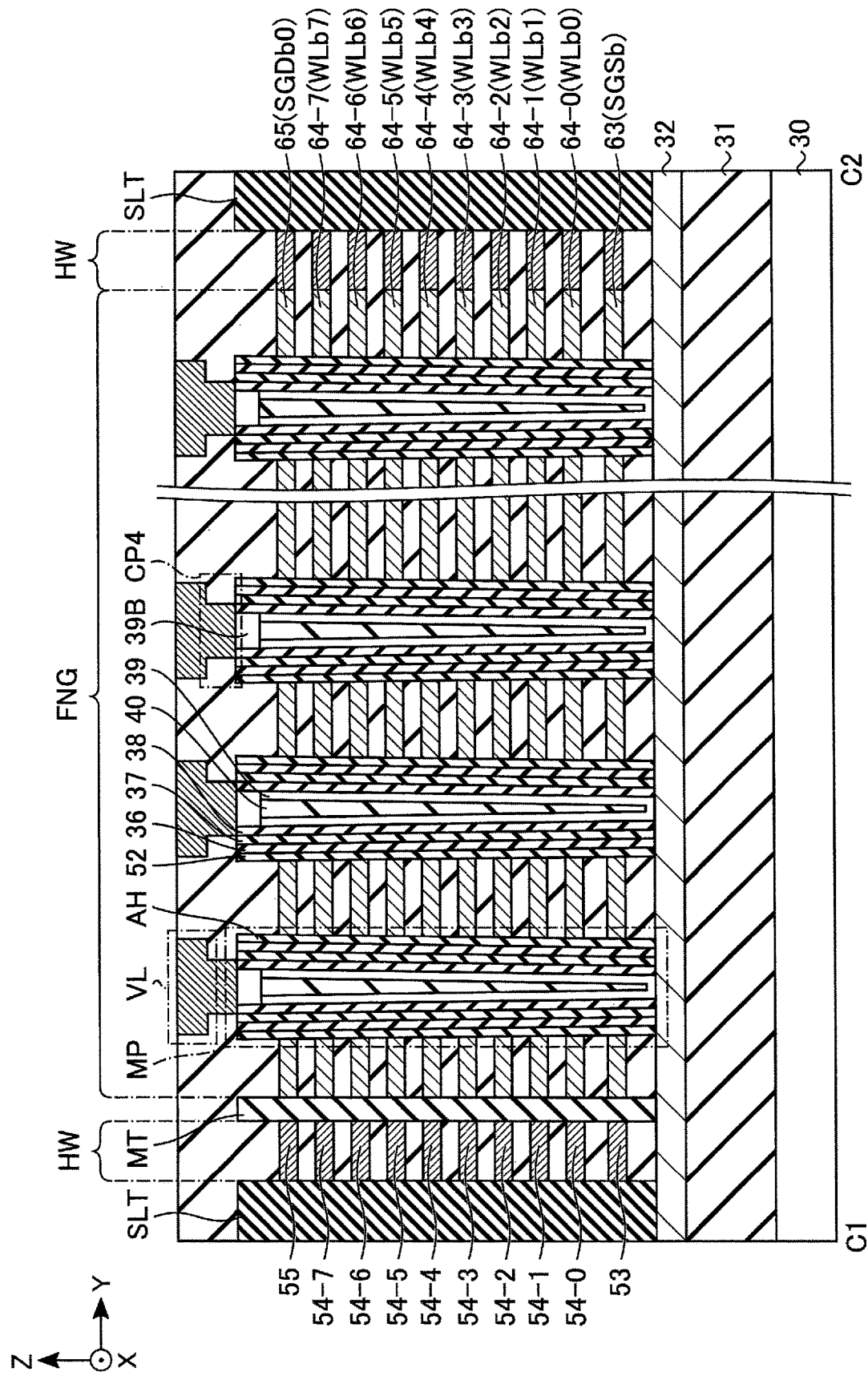
FIG. 28 is a sectional view of the memory cell array, taken along line C1-C2 shown in FIG. 26.

Next, a cross-sectional configuration of the memory cell array 11 will be described with reference to FIGS. 27 and 28. FIG. 27 is a sectional view of the memory cell array 11, taken along line A1-A2 shown in FIG. 26. FIG. 28 is a cross sectional view of the memory cell array 11 taken along line C1-C2, which is not arranged on the memory trench MT extending in the Y-axis direction shown in FIG. 26. To simplify the description, the contact plugs CP2 and the bit lines BL are omitted in the examples shown in FIGS. 28 and 29.

As shown in FIG. 27, on the interconnect layer 32, an interconnect layer 63 that functions as the electrode FNG of select gate line SGS, interconnect layers 64-0 through 64-7 that function as the electrodes FNG of word lines WL0 through WL7, and the interconnect layer 65 that functions as the electrode FNG of select gate line SGD are stacked with a space being interposed therebetween with respect to the Z-axis direction. The interconnect layers 63, 64-0 through 64-7, and 65 are made of a conductive material, for example, poly-Si.

Each memory pillars MP in the present embodiment includes an insulating layer 52, a block insulating film 36, a charge storage layer 37, a tunnel insulating film 38, and semiconductor layers 39 and 39B, and a core layer 40. For the insulating layer 52, aluminum oxide ($AlO_x$) is used, for example. More specifically, in the inner side surface of the hole AH, the insulating layer 52, the block insulating film 36, the charge storage layer 37, and the tunnel insulating film 38 are laminated in order. In the hole AH, a semiconductor layer 39, which is in contact with the tunnel insulating film 38 at its side surface and in contact with the interconnect layer 32 at its bottom surface, is formed, and the inside of the semiconductor layer 39 is filled with the core layer 40. On the semiconductor layer 39 and the core layer 40, a semiconductor layer 39B is formed as a cap layer.

In the plug area, contact plug CP1 that passes through the interconnect layers 63, 64-0 through 64-7, and 65 and reaches the interconnect layer 41 with its bottom surface is formed, and the outer side surface of the contact plug CP1 is covered with the insulating layer 43.

As shown in FIG. 28, an interconnect layer 53 that functions as the electrode HW of select gate line SGS, interconnect layers 54-0 through 54-7 that function as the electrodes HW of word lines WL0 through WL7, and the interconnect layer 55 that functions as the electrode HW of select gate line SGD are stacked with a space interposed therebetween with respect to the Z-axis direction. The interconnect layers 53, 54-0 through 54-7, and 55 are respectively in contact with the side surfaces of the interconnect layers 63, 64-0 through 64-7, and 65. The interconnect layers 53, 54-0 through 54-7 and 55 are made of a conductive material, and a laminated film consisting of, for example, Ti, TiN, and W is used.

3.3 Method of Forming Memory Cell Array

Next, a method of forming the memory cell array 11 will be explained with reference to FIGS. 29 to 33. Each of FIGS.

29 to 33 shows the plane of string unit SU0 explained with reference to FIGS. 26 to 28, the A1-A2 cross section, and the cross section taken along line C1-C2 (hereinafter, the C1-C2 cross section).

Figure 29:
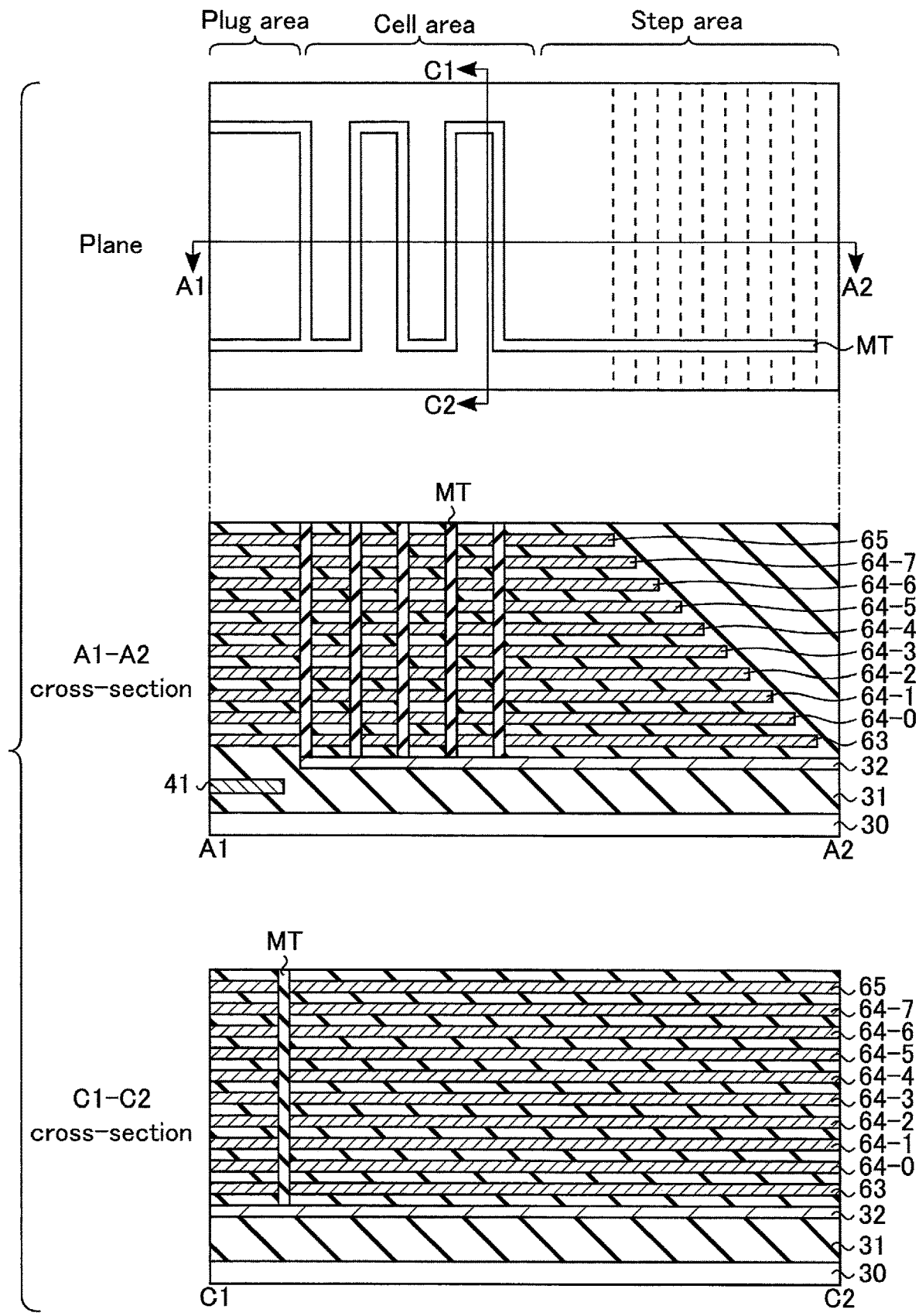
FIGS. 29-33 are diagrams showing a process of manufacturing the semiconductor memory device according to the third embodiment.

As shown in FIG. 29, the interconnect layers 63, 64-0 through 64-7, and 65 are formed above the interconnect layer 32, with the insulating layer 31 being interposed therebetween. At this time, the interconnect layers 63, 64-0 through 64-7, and 65 are made in a stepwise manner in the step area. Then, an insulating layer 31 is further formed on the interconnect layer 65, and the surface is flattened. Next, the memory trench MT is made, and the inside of the memory trench MT is filled with, for example, $SiO_2$.

Figure 30:
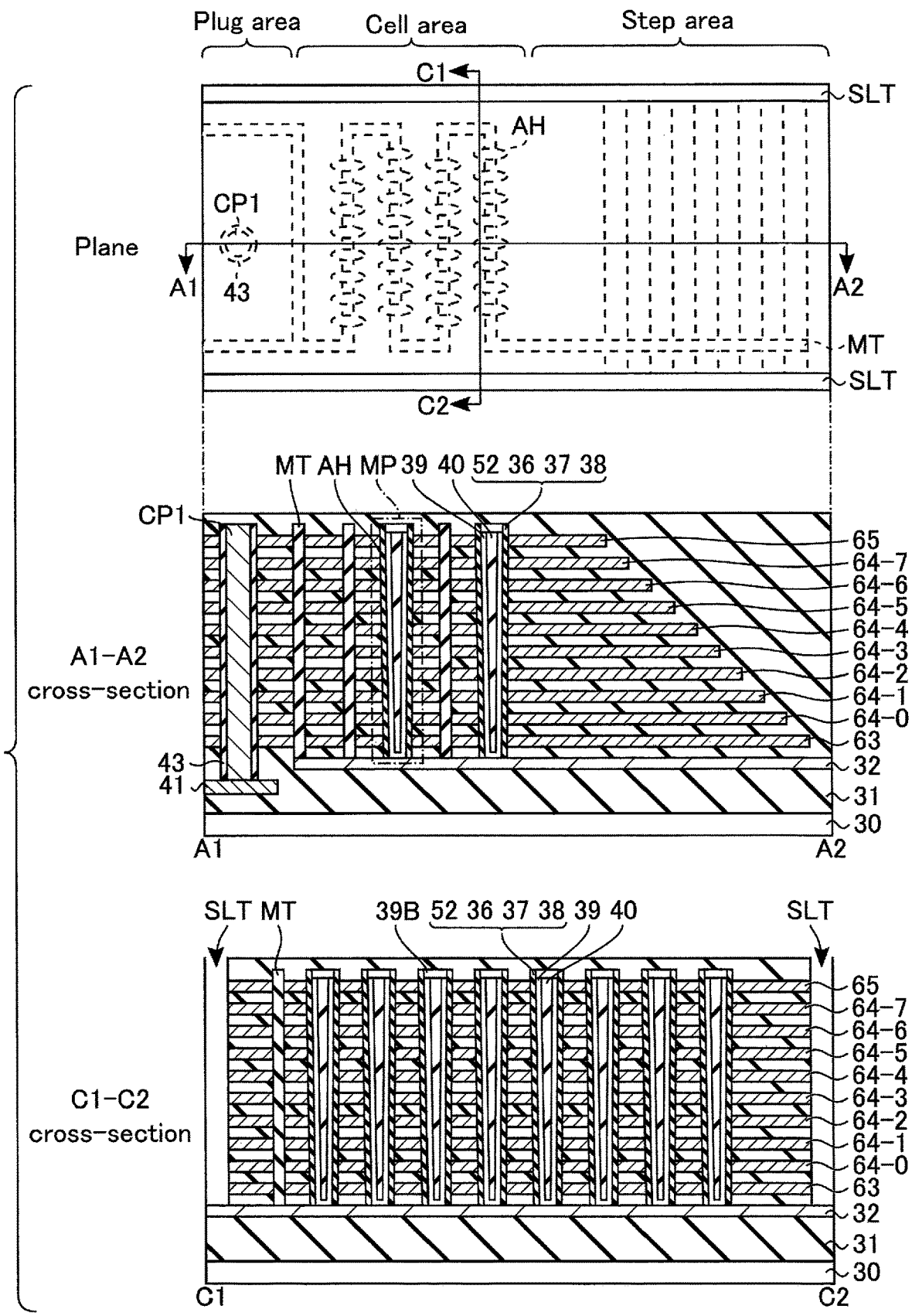

As shown in FIG. 30, the memory pillars MP and contact plug CP1 are formed in a manner similar to the first embodiment as described with reference to FIGS. 9 to 11. Next, after forming the insulating layer 31, the slits SLT reaching the interconnect layer 32 with their bottom surfaces are made. At this time, the side surfaces of the interconnect layers 63, 64-0 through 64-7, and 65 are exposed to the inside of the slits SLT.

Figure 31:
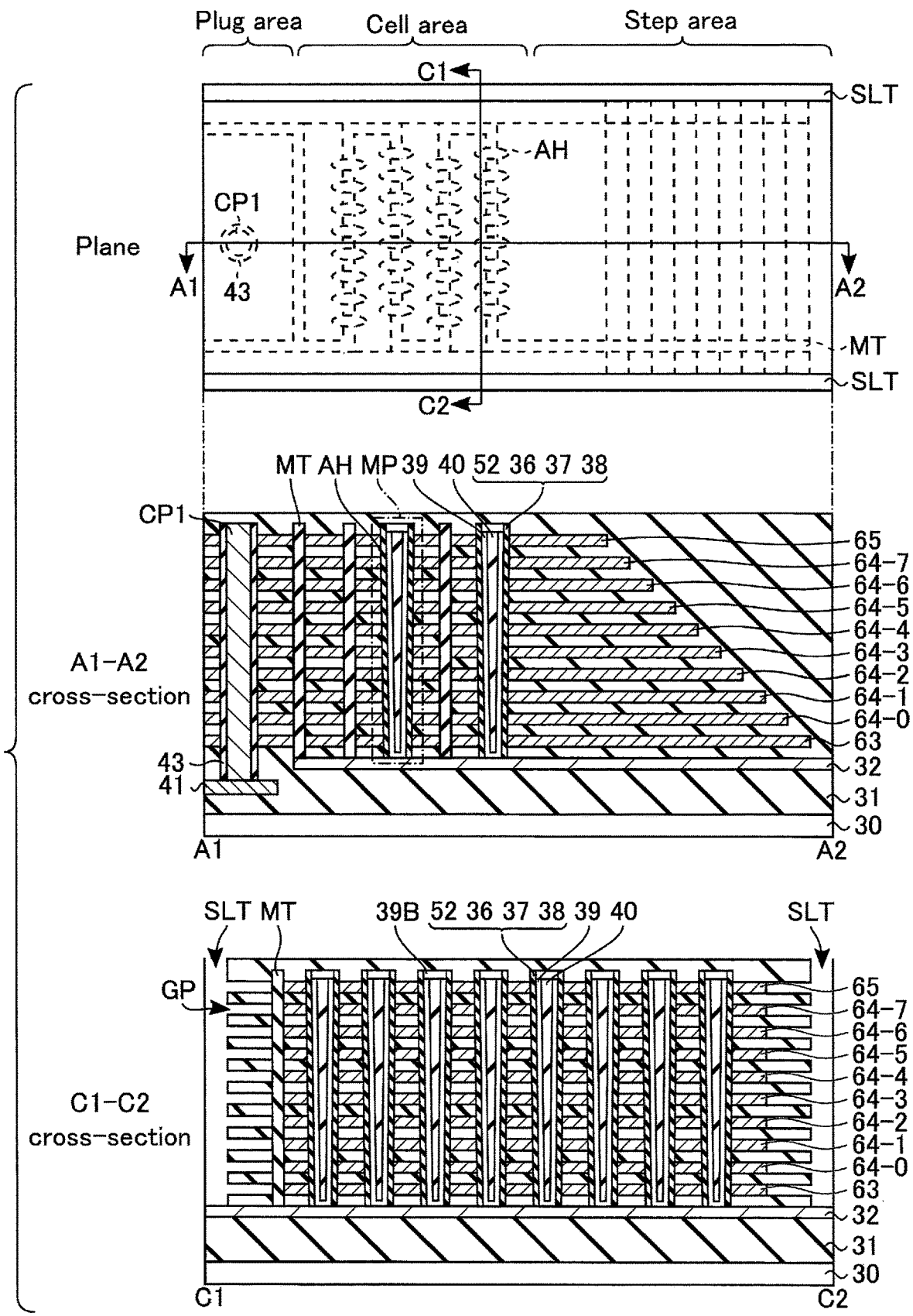

As shown in FIG. 31, the interconnect layers 63, 64-0 through 64-7, and 65 are wet-etched from the slits SLT, and gaps GP are formed in areas where the electrodes HW are to be formed.

Figure 32:
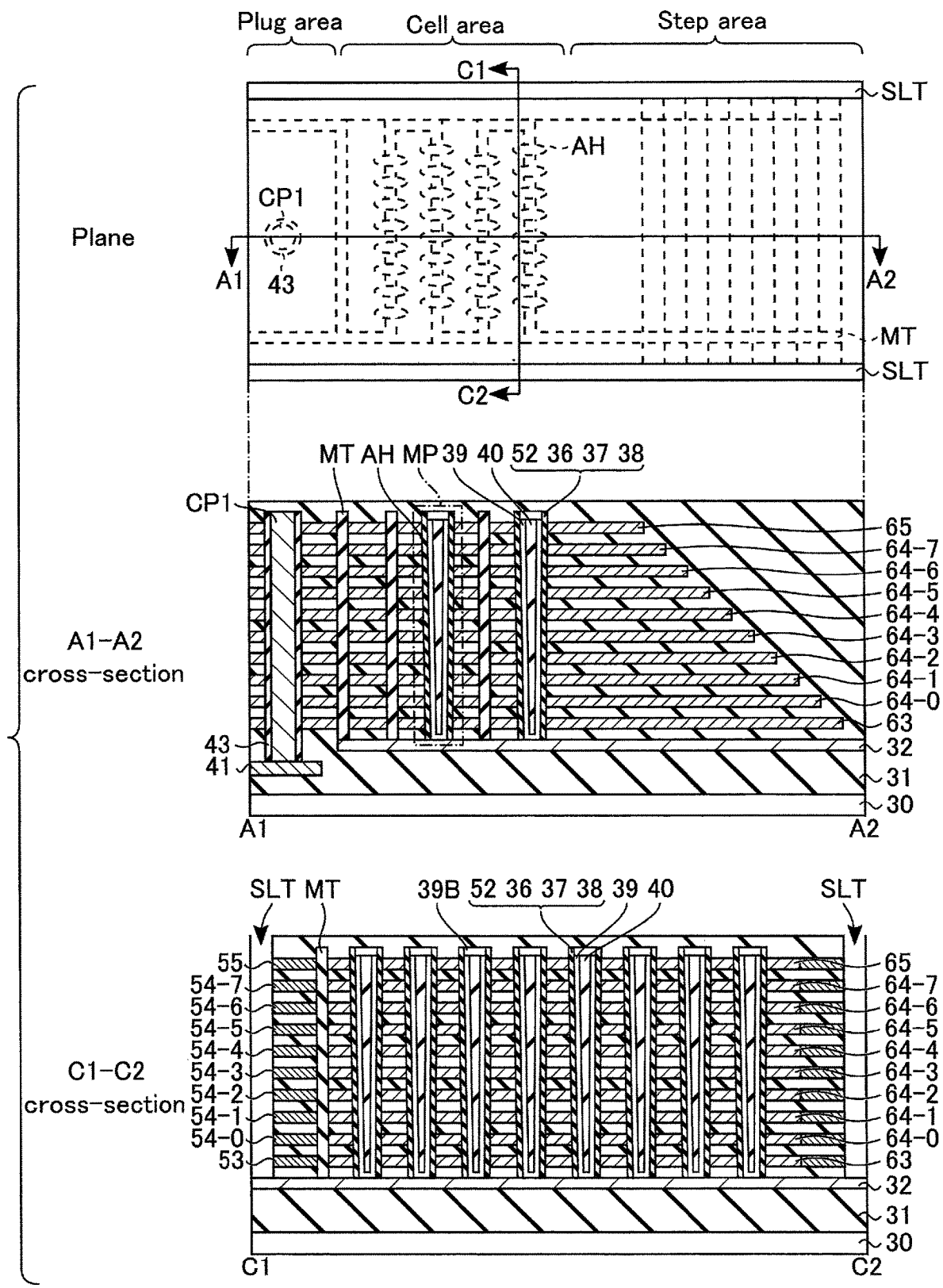

As shown in FIG. 32, the gaps GP are filled with Ti, TiN and W, in order. Next, Ti, TiN, and W on the side surface of the slit SLT and on the top surface of the insulating layer 31 are removed, thereby forming the interconnect layers 53, 54-0 through 54-7, and 55.

Figure 33:
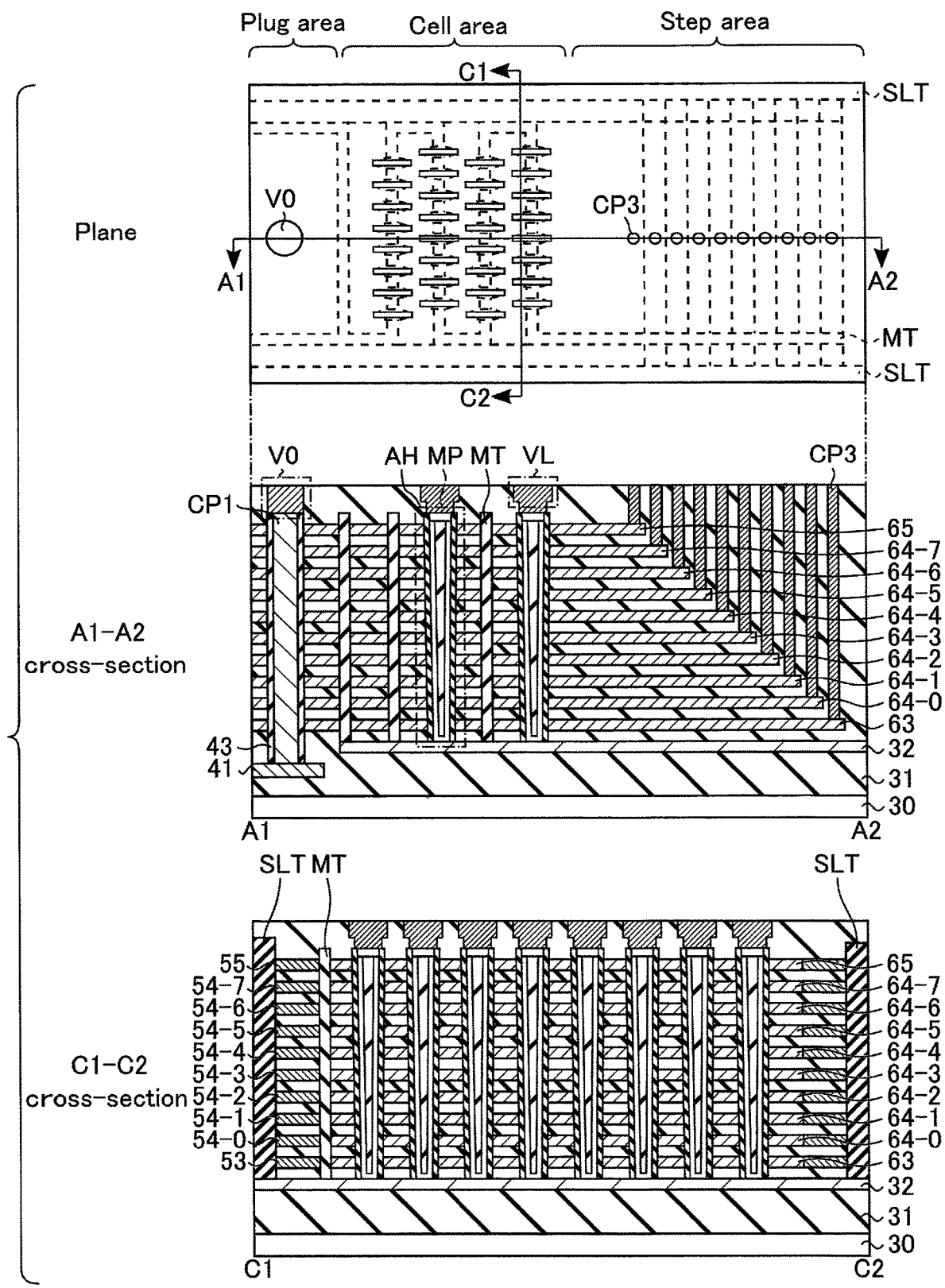

As shown in FIG. 33, the slits SLT are filled with $SiO_2$. Next, contact plug V0, CP4, and CP3, and the interconnect layer VL are formed in a manner similar to the first embodiment as described with reference to FIGS. 13 to 15.

3.4 Advantageous Effects of Third Embodiment

The configuration of the present embodiment achieves advantageous effects similar to those achieved by the first embodiment.

Furthermore, according to the present embodiment, it is possible to suppress an increase in wiring resistance if a material having low resistance is used for the electrodes HW. More specifically, even if poly-Si, which has a higher resistance than W, is used for electrodes FNG, for example, as long as a metallic material having low resistance, such as W, is used for electrodes HW, it is possible to suppress an increase in wiring resistance from the terraces to the memory pillars MP.

The third embodiments may be combined with the second embodiment.

4. Fourth Embodiment

Next, the fourth embodiment will be described. In the fourth embodiment, an example where air gaps are formed between interconnects in the memory cell array 11 described in the third embodiment will be explained. Hereinafter, only the matters different from the third embodiment will be described.

4.1 Cross-Sectional Configuration of Memory Cell Array

Figure 34:
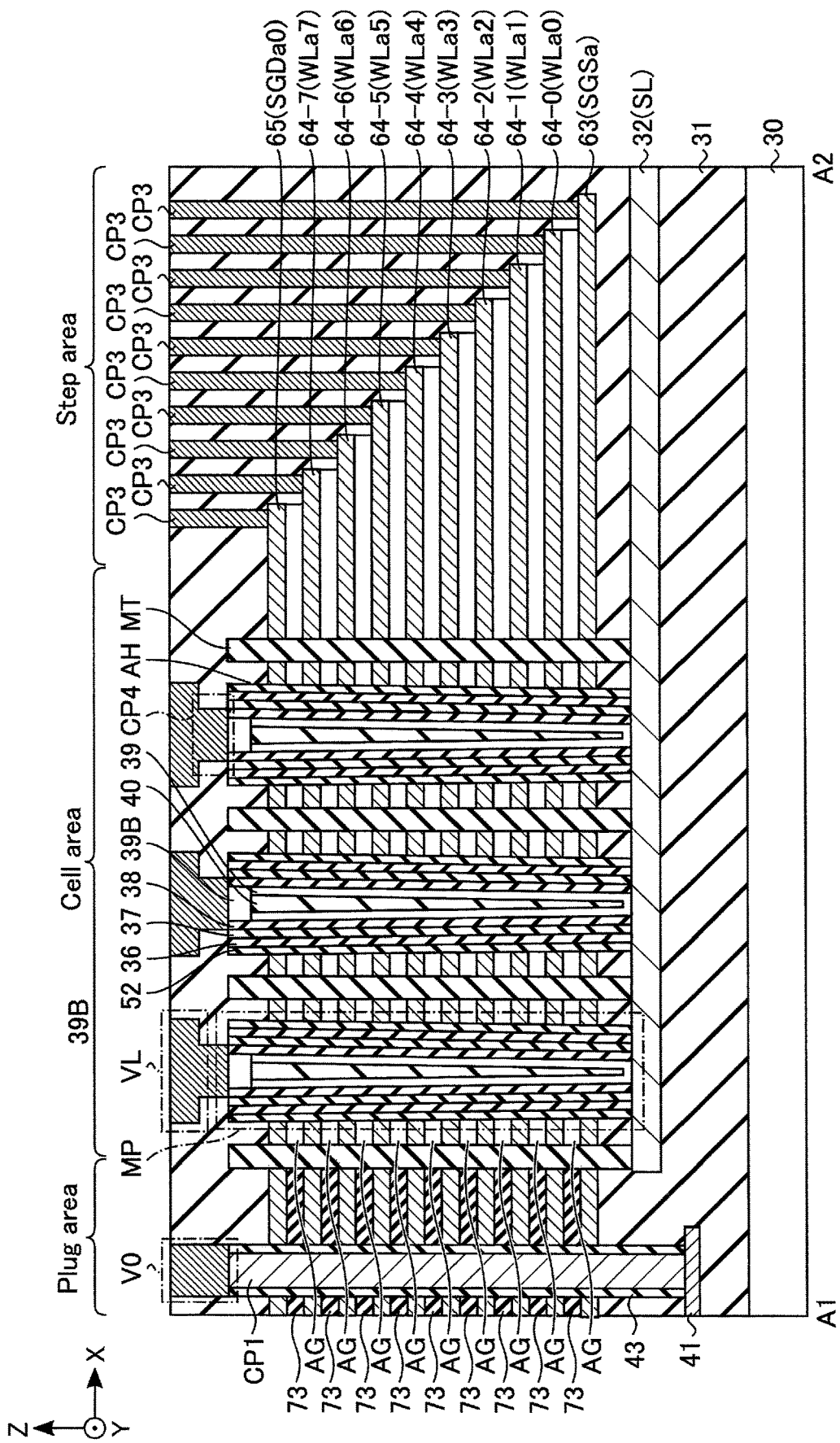
FIG. 34 is a sectional view of a memory cell array included in a semiconductor memory device according to a fourth embodiment, taken along line A1-A2.
Figure 35:
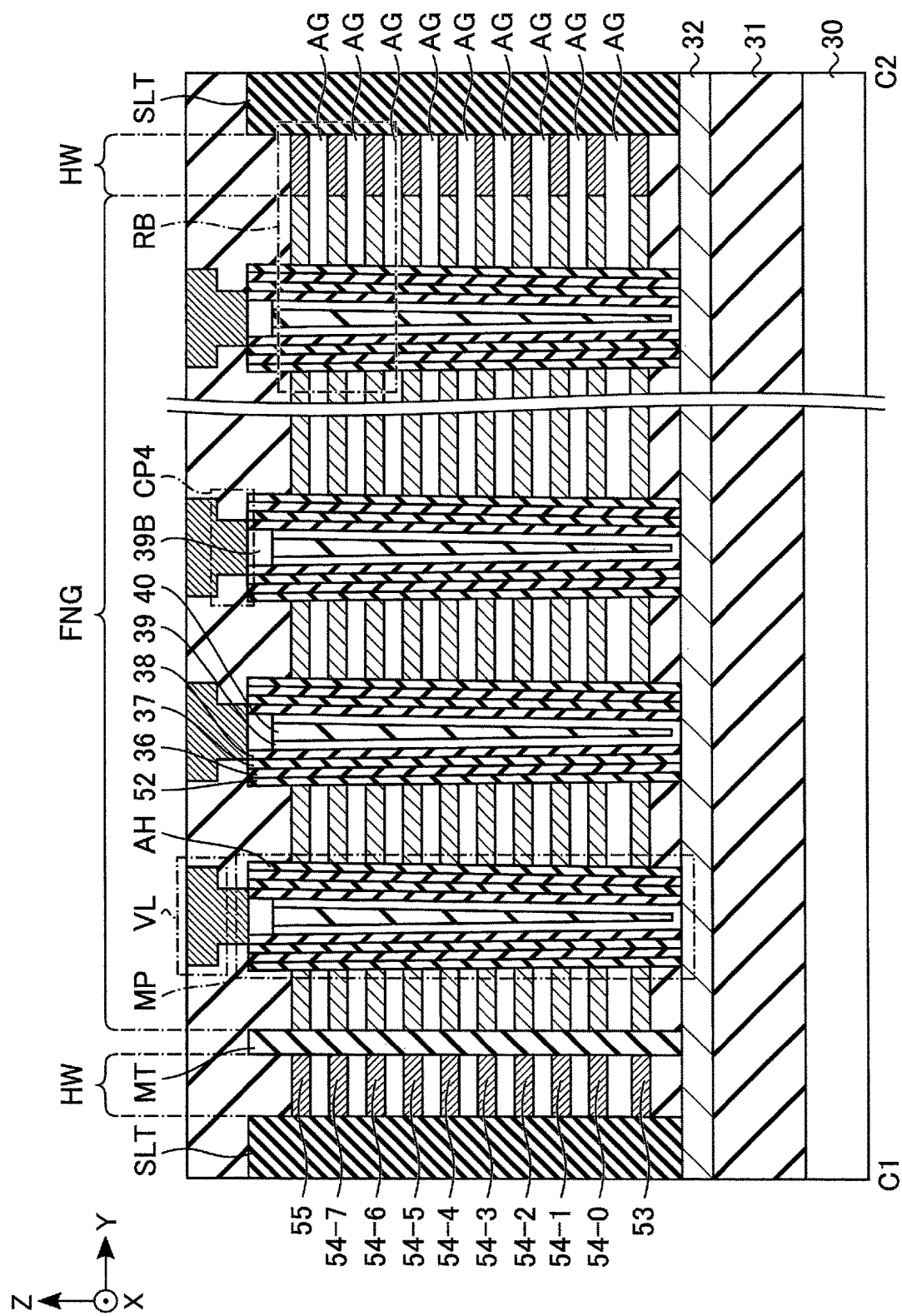
FIG. 35 is a sectional view of the memory cell array included in the semiconductor memory device according to the fourth embodiment, taken along line C1-C2.
Figure 36:
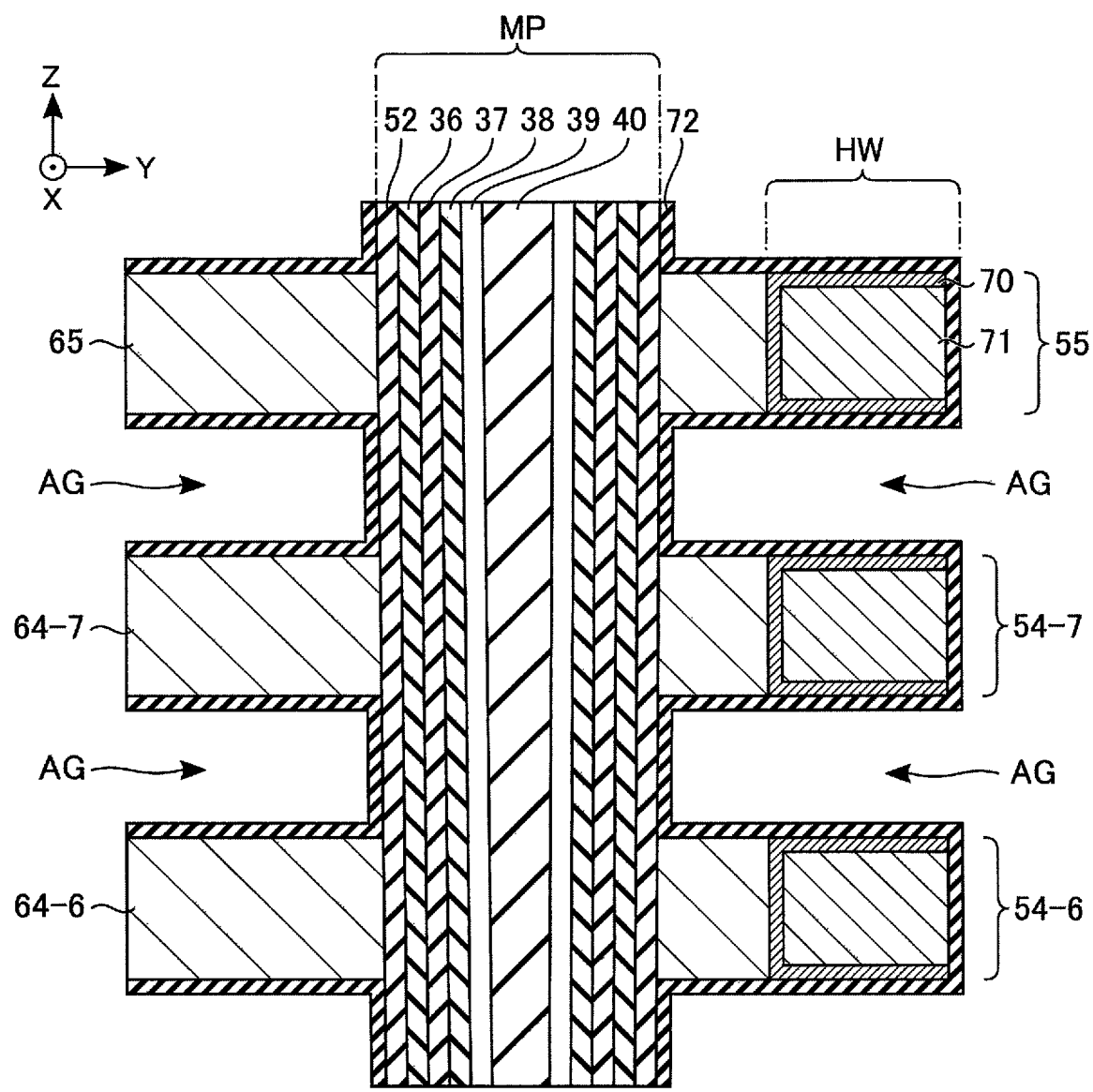
FIG. 36 is a sectional view of a memory pillar in the memory cell array included in the semiconductor memory device according to the fourth embodiment.

Next, a cross-sectional configuration of the memory cell array 11 will be described with reference to FIGS. 34 to 36. FIG. 34 is a sectional view of the memory cell array 11, taken along line A1-A2 shown in FIG. 26. FIG. 35 is a sectional view of the memory cell array 11, taken along line C1-C2 shown in FIG. 26. FIG. 36 is an enlarged view of the memory pillar MP in the region RB shown in FIG. 35. To simplify the description, the contact plugs CP2 and the bit lines BL are omitted in the examples shown in FIGS. 34 and 35.

As shown in FIGS. 34 and 35, air gaps AG are formed between the interconnect layers 63, 64-0 through 64-7, and 65 and between the interconnect layers 53, 54-0 through 54-7, and 55.

In the plug area, ten interconnect layers 63, 64-0 through 64-7, 65, and nine sacrificial layers 73 used to form the air gaps AG are alternately stacked. The sacrificial layers 73 in the plug area are not etched even during the process of forming the air gaps AG, which will be described later. However, the sacrificial layers 73 in the plug area may be removed to form the air gaps AG in the plug area.

Contact plug CP1 that passes through the interconnect layers 63, 64-0 through 64-7, and 65 and the nine sacrificial layers 73, and reaches the interconnect layer 41 with its bottom surface is formed, and the outer side surface of contact plug CP1 is covered with the insulating layer 43.

Other than what is described herein, the configuration of the memory cell array according to the fourth embodiment is the same as that of the third embodiment shown in FIGS. 27 and 28.

As shown in FIG. 36, in the interconnect layers 54-6, 54-7, and 55, the upper and bottom surfaces thereof, and the sides thereof that are respectively in contact with the interconnect layers 64-6, 64-7, and 65 are covered by the barrier layer 70, and the insides thereof are filled with the conductive layer 71. For example, Ti and TiN are used for the barrier layer 70, and W is used for the conductive layer 71. The interconnect layers 64-6, 64-7, and 65 extend in the Y-axis direction, and are in contact with the insulating layers 52 of the memory pillar MP. Then, an insulating layer 72 is formed so as to cover the memory pillars, the interconnect layers 64-6, 64-7, and 65, and the interconnect layers 54-6, 54-7 and 55, and the air gaps AG are formed in the areas surrounded by the insulating layer 72 and the slit SLT. For the insulating layer 72, $SiO_2$ is used, for example.

4.2 Method of Forming Memory Cell Array

Next, a method of forming the memory cell array 11 will be explained with reference to FIGS. 37 to 39.

Figure 37:
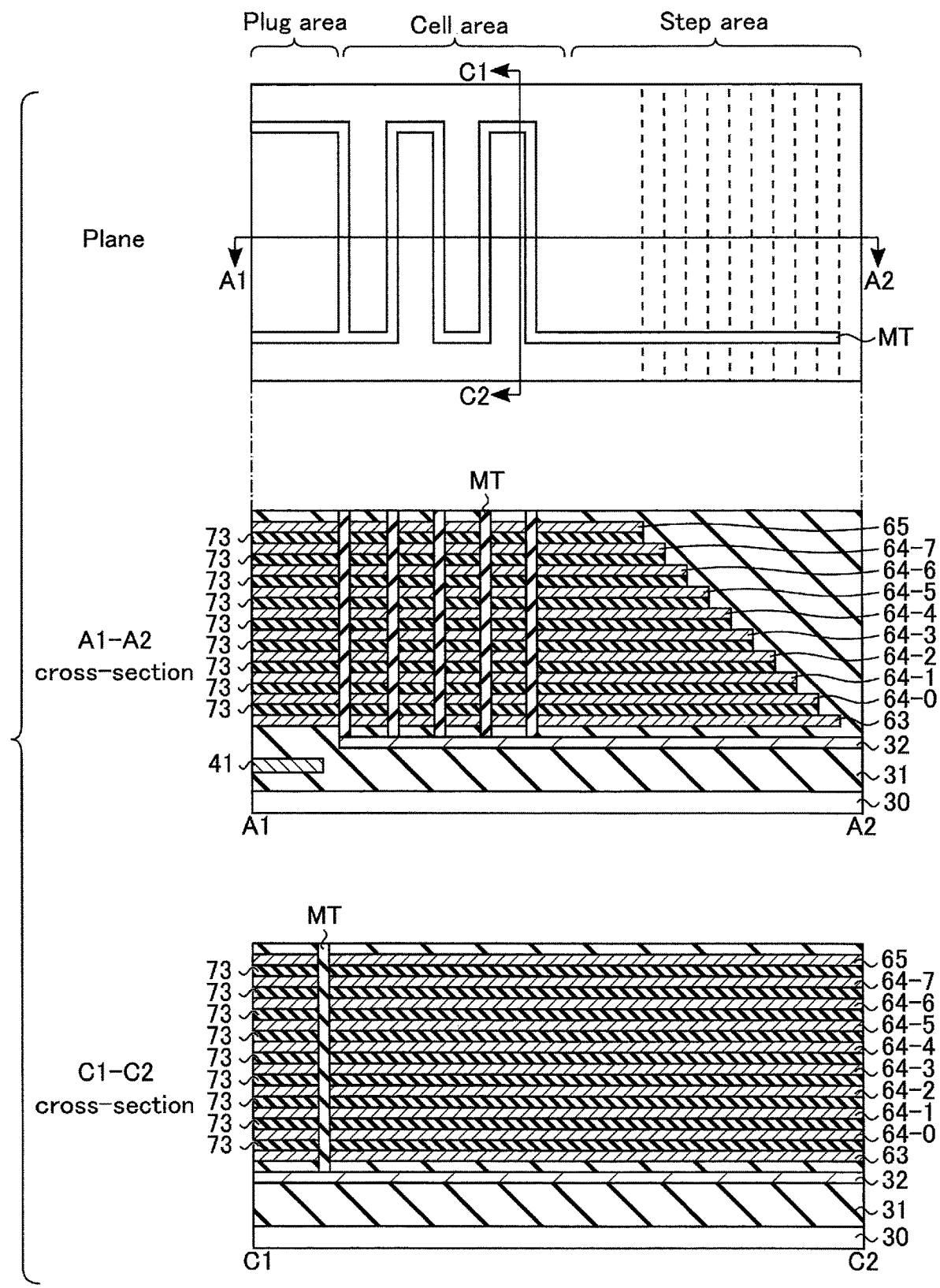
FIGS. 37-39 are diagrams showing a process of manufacturing the semiconductor memory device according to the fourth embodiment.

As shown in FIG. 37, after forming the insulating layer 31 on the interconnect layer 32, ten interconnect layers 63, 64-0 through 64-7, and 65 and nine sacrificial layers 73 are alternately stacked. For the sacrificial layers 73, SiN is used, for example. The interconnect layers 63, 64-0 through 64-7, and 65 are made in a stepwise manner in the step area. Next, after further forming the insulating layer 31 on the interconnect layer 65, the memory trench MT is made, and the inside of the memory trench MT is filled with, for example $SiO_2$.

Figure 38:
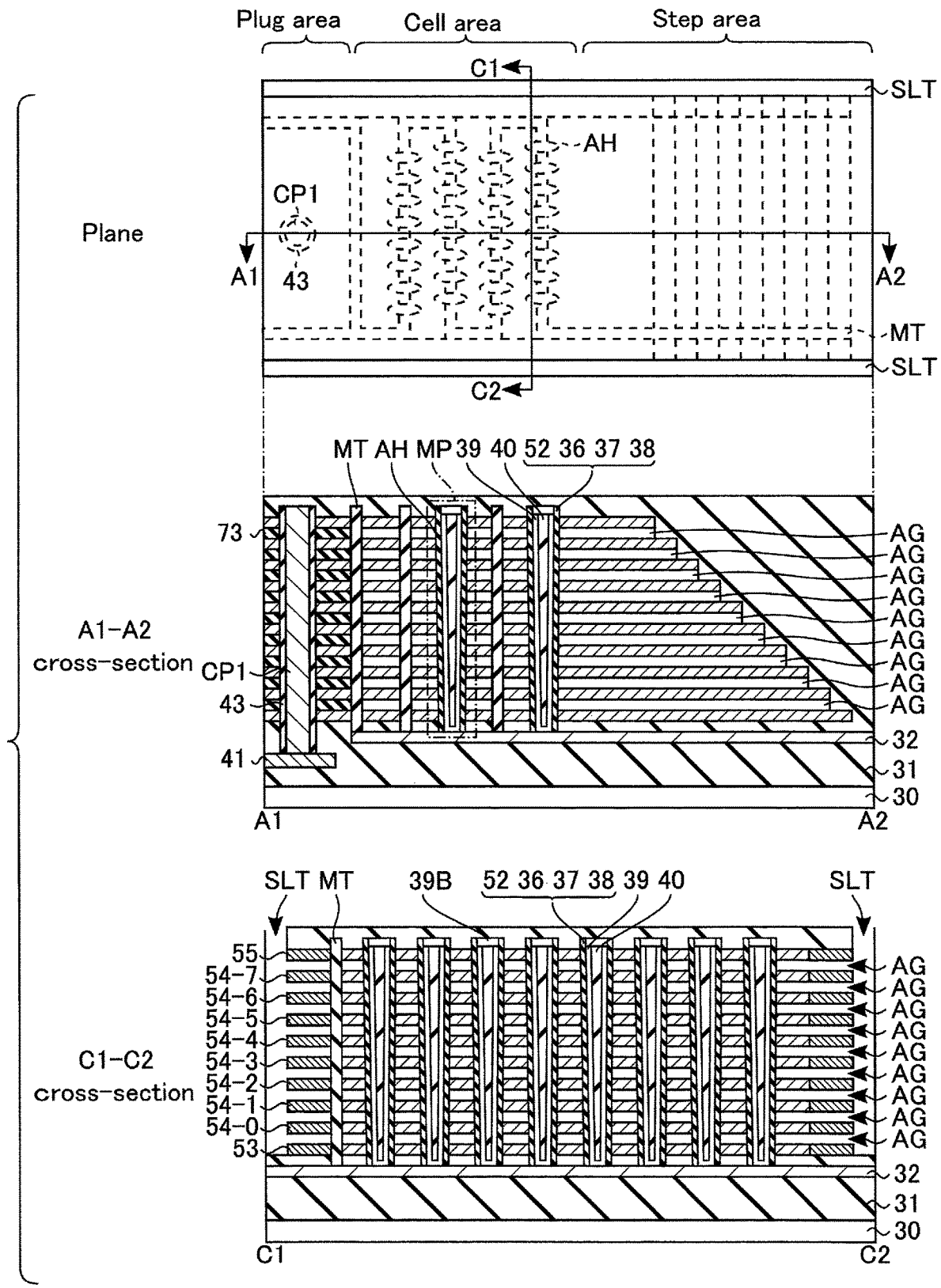

As shown in FIG. 38, similarly to FIG. 32 showing the third embodiment, after forming the interconnect layers 53, 54-0 through 54-7, and 55, the sacrificial layers 73 are removed by wet etching, and the air gaps AG are formed.

Figure 39:
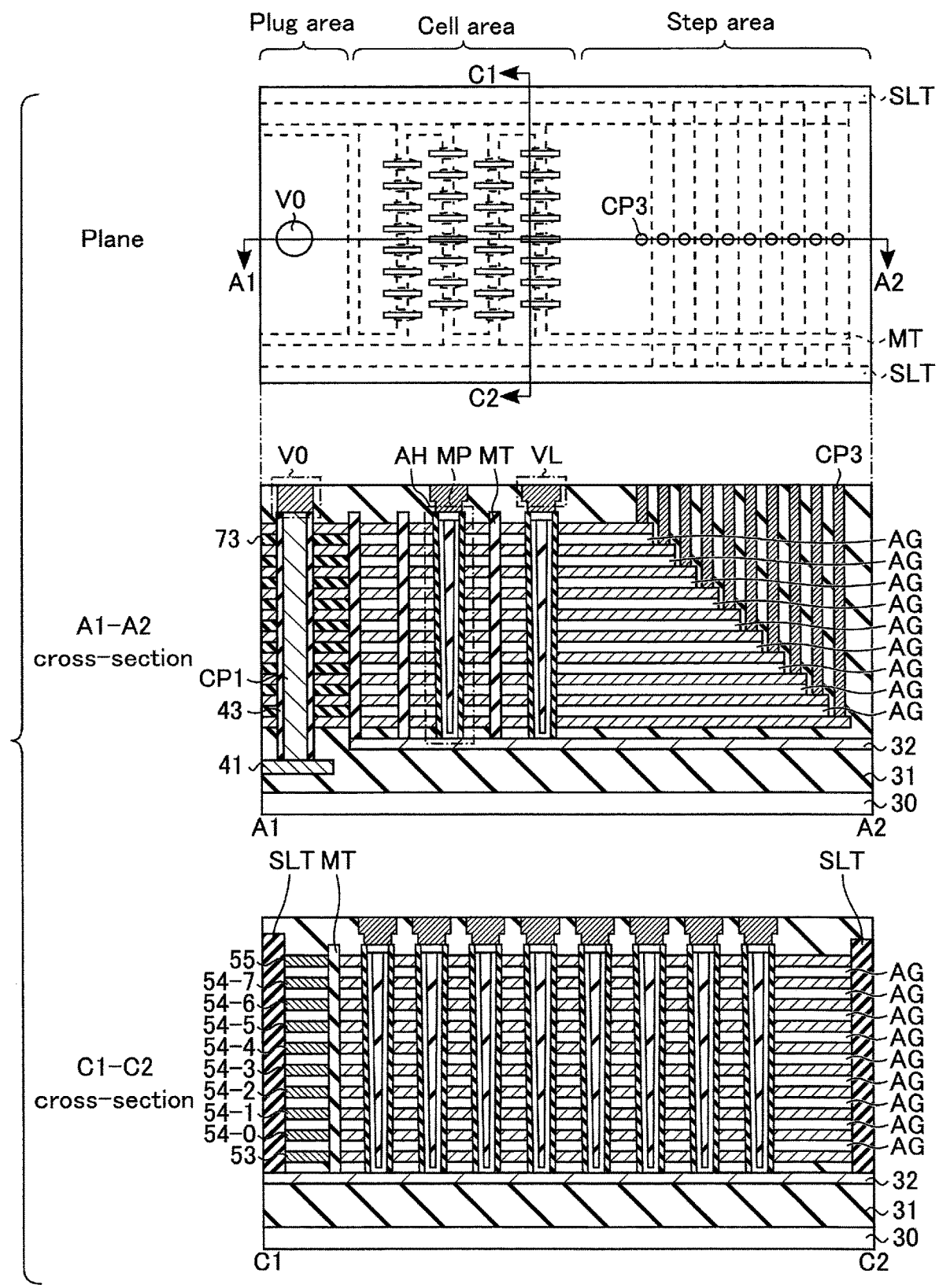

As shown in FIG. 39, after forming the insulating layers 72, the slits SLT are filled with $SiO_2$.

4.3 Advantageous Effects of Fourth Embodiment

The configuration of the present embodiment achieves advantageous effects similar to those achieved by the first embodiment.

Furthermore, according to the configuration of the present invention, it is possible to form air gaps between select gate line SGS and a word line WL, between word lines WL, and between a word line WL and a select gate line SGD. It is thereby possible to reduce a wiring capacitance of the word lines WL, and to reduce an RC delay. The performance of the semiconductor memory device can be thus improved.

Furthermore, according to the present embodiment, it is possible to reduce a leakage current between the word lines WL by forming the air gaps, thereby improving breakdown voltage. The reliability of the semiconductor memory device can be thus improved.

Furthermore, according to the present embodiment, it is possible to reduce a wiring capacitance of the word lines WL, and to reduce an interval of the word lines WL in the Z-axis direction. The semiconductor memory device can be thereby highly integrated.

The first and second embodiments may be combined with the fourth embodiment. In other words, the air gaps may be formed in the first and second embodiments.

5. Modifications, Etc

The semiconductor memory device according to the above embodiments includes: a semiconductor substrate (30); a first interconnect layer (WLa7) provided above the semiconductor substrate and including a first electrode (FNG) that extends in a first direction (Y-axis direction) parallel to the semiconductor substrate, and a second electrode (HW) that extends in a second direction (X-axis direction) and is in contact with one end of the first electrode, the second direction intersecting the first direction and being parallel to the semiconductor substrate; a second interconnect layer (WLb7) including a third electrode (FNG) that is provided adjacently to the first electrode in the second direction, is non-electrically coupled to the first electrode, and extends in the first direction, and a fourth electrode (HW) that extends in the second direction and is in contact with one end of the third electrode; a first semiconductor layer (39) provided between the first electrode and the third electrode and extending in a third direction (Z-axis direction) perpendicular to the semiconductor substrate; a first storage (MCa7) provided between the first semiconductor layer and the first electrode; a second storage (MCb7) provided between the first semiconductor layer and the third electrode; and a first bit line (BL) provided above the first semiconductor layer, extending in the first direction, and electrically coupled to the first semiconductor layer.

By applying the forgoing embodiments, it is possible to provide a semiconductor memory device of improved reliability. The embodiments are not limited to the above-described aspects, but can be modified in various ways.

The first to fourth embodiments can be combined as far as possible.

In addition, the term "couple" in the foregoing embodiments includes a state of indirect coupling via, for example, a transistor or a resistance.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
a conductive layer;
at least one first interconnect layer above the conductive layer and including a first electrode that extends in a first direction, and a second electrode that extends in a second direction and is in contact with one end of the first electrode, the second direction intersecting the first direction;
a second interconnect layer above the conductive layer and including a third electrode that is provided in the second direction of the first electrode and extends in the first direction, and a fourth electrode that extends in the second direction and is in contact with one end of the third electrode;
a first bit line provided above the at least one first interconnect layer and the second interconnect layer, and extending in the first direction;
a first semiconductor layer provided between the first electrode and the third electrode, extending in a third direction intersecting the first direction and the second direction, and including a first end portion electrically connected to the conductive layer and a second end portion electrically connected to the first bit line;
a first charge storage layer provided between the first semiconductor layer and the first electrode;
a second charge storage layer provided between the first semiconductor layer and the third electrode; a first plug provided on the first semiconductor layer; and
a third interconnect layer provided on the first plug, electrically coupled to the first bit line, and extending in the first direction.

2. The device according to claim 1, further comprising:
a second semiconductor layer provided between the first electrode and the third electrode, and extending in the third direction;
a third charge storage layer between the second semiconductor layer and the first electrode;
a fourth charge storage layer provided between the second semiconductor layer and the third electrode; and
a second bit line provided above the first semiconductor layer and the second semiconductor layer and adjacently to the first bit line, extending in the first direction, and electrically coupled to the second semiconductor layer.

3. The device according to claim 2, wherein
the at least one first interconnect layer further includes a fifth electrode that is provided adjacently to the third electrode in the second direction, extends in the first direction, and is in contact with the second electrode at one end of the fifth electrode, and
the second interconnect layer further includes a sixth electrode that is provided adjacently to the fifth electrode in the second direction, extends in the first direction, and is in contact with the fourth electrode at one end of the sixth electrode.

4. The device according to claim 3, further comprising:
a plurality of third semiconductor layers provided between the third electrode and the fifth electrode, extending in the third direction, and arranged along the first direction; and
a plurality of fourth semiconductor layers provided between the fifth electrode and the sixth electrode, extending in the third direction, and arranged along the first direction.

5. The device according to claim 2, further comprising:
a seventh interconnect layer provided above the at least one first interconnect layer and including a fifth electrode provided above the first electrode and a sixth electrode provided above the second electrode;
a fourth interconnect layer provided above the second interconnect layer and including a seventh electrode provided above the third electrode and a eighth electrode provided above the fourth electrode;
a fifth interconnect layer provided above the seventh interconnect layer and the fourth interconnect layers, extending in the first direction, and passed through by the first semiconductor layer;
a sixth interconnect layer provided above the seventh interconnect layer and the fourth interconnect layers, extending in the first direction, being adjacent to the seventh interconnect layer in the first direction, and passed through by the second semiconductor layer;
a first transistor provided between the fifth electrode and the first semiconductor layer;
a second transistor provided between the fifth electrode and the second semiconductor layer;
a third transistor provided between the sixth electrode and the first semiconductor layer;
a fourth transistor provided between the sixth electrode and the second semiconductor layer;
a fifth transistor provided between the fifth interconnect layer and the first semiconductor layer; and
a sixth transistor provided between the sixth interconnect layer and the second semiconductor layer.

6. The device according to claim 5, wherein
when the first charge storage layer is selected, a first voltage at a first logic level is applied to the seventh interconnect layer and the fifth interconnect layers, a second voltage at a second logic level is applied to the fourth interconnect layer and the and sixth interconnect layers,
when the second charge storage layer is selected, the first voltage is applied to the fourth interconnect layer and the fifth interconnect layers, and the second voltage is applied to the third and sixth interconnect layers,
when the third charge storage layer is selected, the first voltage is applied to the seventh interconnect layer and the sixth interconnect layers, and the second voltage is applied to the fourth interconnect layer and the fifth interconnect layers,
when the fourth charge storage layer is selected, the first voltage is applied to the fourth interconnect layer and the sixth interconnect layers, and the second voltage is applied to the seventh interconnect layer and the fifth interconnect layers.

7. The device according to claim 6, wherein
the first through sixth transistors are turned to an on state when the first voltage is applied, and are turned to an off state when the second voltage is applied.

8. The device according to claim 1, further comprising:
a first insulating layer provided between the first electrode and the first charge storage layer; and
a second insulating layer provided between the first charge storage layer and the first semiconductor layer.

9. The device according to claim 8, further comprising
a second plug passing through the first electrode, a side surface of the second plug being covered with the first insulating layer, an upper surface of the second plug being located at a same height as an upper surface of the first semiconductor layer, a bottom surface of the second plug being located below the third interconnect layer.

10. The device according to claim 1, further comprising:
a fourth interconnect layer extending in the first direction and being in contact with a bottom surface of the first semiconductor layer at an upper surface of the fourth interconnect layer.

11. The device according to claim 1, wherein
the first semiconductor layer has a cylindrical shape, a diameter of the first semiconductor layer in the first direction being longer than a diameter in the second direction.

12. The device according to claim 1, wherein
a length of the third interconnect layer in the first direction is longer than a length of the first semiconductor layer in the first direction.

13. The device according to claim 1, wherein
the at least one first interconnect layer further includes a first coupling section that extends in the first direction, is coupled to an end of the second electrode at one end of the first coupling section, and is coupled to a second plug at an upper surface of the first coupling section,
the second interconnect layer further includes a second coupling section that extends in the first direction, is coupled to an end of the fourth electrode at one end of the second coupling section, and is coupled to a third plug at an upper surface of the second coupling section.

14. The device according to claim 1, wherein a first conductive material is used for the first electrode and the third electrodes, and a second conductive material different from the first conductive material is used for the second electrode and the fourth electrodes.

15. The device according to claim 14, wherein
the first conductive material includes silicon, and the second conductive material includes tungsten.

16. The device according to claim 1, wherein the at least one interconnect layer is a plurality of first interconnect layers, wherein the plurality of first interconnect layers are stacked in the third direction, and air gaps are provided between the plurality of first interconnect layers.

17. The device according to claim 1, further comprising:
a substrate provided below the at least one first interconnect layer, the substrate extending in the first direction and the second direction.

18. A semiconductor memory device, comprising:
a conductive layer;
a first interconnect layer above the conductive layer and including a first electrode that extends in a first direction, and a second electrode that extends in a second direction and is in contact with one end of the first electrode, the second direction intersecting the first direction;
a second interconnect layer above the conductive layer and including a third electrode that is provided in the second direction of the first electrode and extends in the first direction, and a fourth electrode that extends in the second direction and is in contact with one end of the third electrode;
a first bit line provided above the first interconnect layer and the second interconnect layer, and extending in the first direction;
a first semiconductor layer provided between the first electrode and the third electrode, extending in a third direction intersecting the first direction and the second direction, and including a first end portion electrically connected to the conductive layer and a second end portion electrically connected to the first bit line;

a first charge storage layer provided between the first semiconductor layer and the first electrode;

a second charge storage layer provided between the first semiconductor layer and the third electrode;

a third interconnect layer extending in the first direction and being in contact with a bottom surface of the first semiconductor layer at an upper surface of the third interconnect layer;

a plurality of first insulating layers provided along the third direction;

a first plug that passes through the plurality of first insulating layers and is provided between the second electrode and the first electrode in the first direction, an upper surface of the first plug being located at a same height as a height of the first semiconductor layer, a bottom surface of the first plug being located below the third interconnect layer; and a second insulating layer provided on a side surface of the first plug.

* * * * *